(12) United States Patent
Kamoshita

(10) Patent No.: US 8,841,729 B2
(45) Date of Patent: Sep. 23, 2014

(54) SEMICONDUCTOR DEVICE AND METHOD OF MANUFACTURING SEMICONDUCTOR DEVICE

(71) Applicant: Lapis Semiconductor Co., Ltd., Kanagawa (JP)

(72) Inventor: Junichi Kamoshita, Miyagi (JP)

(73) Assignee: Lapis Semiconductor Co., Ltd., Yokohama (JP)

(*) Notice: Subject to any disclaimer, the term of this patent is extended or adjusted under 35 U.S.C. 154(b) by 0 days.

(21) Appl. No.: 13/968,454

(22) Filed: Aug. 16, 2013

(65) Prior Publication Data

US 2014/0061804 A1 Mar. 6, 2014

(30) Foreign Application Priority Data

Aug. 29, 2012 (JP) .................. 2012-188888

(51) Int. Cl.
*H01L 27/088* (2006.01)
*H01L 29/66* (2006.01)
*H01L 21/8234* (2006.01)
*H01L 27/02* (2006.01)
*H01L 29/78* (2006.01)

(52) U.S. Cl.
CPC ...... *H01L 29/7831* (2013.01); *H01L 29/66484* (2013.01); *H01L 21/823481* (2013.01); *H01L 21/823437* (2013.01); *H01L 27/0207* (2013.01); *H01L 27/088* (2013.01)
USPC ........... 257/365; 257/501; 438/275; 438/283; 438/427

(58) Field of Classification Search
CPC .................................................. H01L 21/76229
USPC ........... 257/365, 501; 438/275, 283, 424–427
See application file for complete search history.

(56) References Cited

U.S. PATENT DOCUMENTS

2002/0130382 A9* 9/2002 Shimizu et al. ............... 257/501

FOREIGN PATENT DOCUMENTS

| JP | H10-056059 | 2/1998 |
| JP | 2010-040896 | 2/2010 |

* cited by examiner

*Primary Examiner* — Daniel Shook
(74) *Attorney, Agent, or Firm* — Volentine & Whitt, PLLC

(57) ABSTRACT

Provided is a semiconductor device including active regions formed in a semiconductor substrate and arranged in a first direction parallel to a surface of the semiconductor substrate; a first element isolating region formed in the semiconductor substrate and electrically isolating adjacent active regions from each other; and gate electrodes extending over the active regions respectively and arranged in the first direction. The first element isolating region includes a first region extending in a second direction orthogonal to the first direction and a second region extending in a direction intersecting the first region, one gate electrode of adjacent gate electrodes has a first edge side which includes a first overlap part placed on the second region, and another gate electrode of the adjacent gate electrodes has a second edge side which faces the first edge side and includes a second overlap part placed on the second region.

17 Claims, 30 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device having an element isolating region and a method of manufacturing the semiconductor device.

2. Description of the Related Art

For the purpose of improving integration of a semiconductor integrated circuit or the like, a trench structure has been used as an element isolating region for electrically isolating a plurality of element regions from each other on a semiconductor substrate, as described in Japanese Patent Application Publication No. 10-56059 (Patent Document 1), for example. Besides, it has been known that a leakage current between a source and a drain in a MOS transistor is reduced by forming a gate electrode so that an edge side of the gate electrode is placed on the element isolating region, as described in Japanese Patent Application Publication No. 2010-40896 (Patent Document 2), for example.

However, in a case where the element isolating region is formed to have an extremely small width in the trench structure for further improving integration, some problematic states are expected: a state where the edge side of the gate electrode is not placed on the element isolating region due to the manufacturing error of the edge side of the gate electrode and therefore a leakage current between the source and the drain cannot be reduced, a state where adjacent gate electrodes are overlapped each other on the element isolating region with the result that a short circuit occurs between the adjacent gate electrodes, and so on.

SUMMARY OF THE INVENTION

It is an object of the present invention to provide a semiconductor device capable of reducing a leakage current between a source and a drain and making it difficult to cause a short circuit between adjacent gate electrodes, even if a width of an element isolating region is extremely small in a trench structure, and to provide a method of manufacturing the semiconductor device.

According to an aspect of the present invention, a semiconductor device includes: a plurality of active regions formed in a semiconductor substrate, the plurality of active regions being arranged in a first direction which is parallel to a surface of the semiconductor substrate; a first element isolating region formed in the semiconductor substrate, the first element isolating region electrically isolating adjacent active regions out of the plurality of active regions from each other; and a plurality of gate electrodes formed on the surface of the semiconductor substrate so that the plurality of the gate electrodes extends over the plurality of active regions respectively, the plurality of gate electrodes being arranged in the first direction. The first element isolating region includes, between the adjacent active regions, a first region extending in a second direction which is parallel to the surface and orthogonal to the first direction and a second region extending in a direction which is parallel to the surface and intersects the first region, one gate electrode of adjacent gate electrodes out of the plurality of gate electrodes has a first edge side which includes a first overlap part placed on the second region, and another gate electrode of the adjacent gate electrodes has a second edge side which faces the first edge side and includes a second overlap part placed on the second region.

According to another aspect of the present invention, a method of manufacturing a semiconductor device, includes: forming a plurality of active regions in a semiconductor substrate, the plurality of active regions being arranged in a first direction which is parallel to a surface of the semiconductor substrate; forming a first element isolating region in the semiconductor substrate, the first element isolating region electrically isolating adjacent active regions out of the plurality of active regions from each other; and forming a plurality of gate electrodes on the surface of the semiconductor substrate so that the plurality of gate electrodes extends over the plurality of active regions respectively, the plurality of gate electrodes being arranged in the first direction. The forming of the first element isolating region is performed so that the first element isolating region includes, between the adjacent active regions, a first region extending in a second direction which is parallel to the surface and orthogonal to the first direction and a second region extending in a direction which is parallel to the surface and intersects the first region, and the forming of the plurality of gate electrodes is performed so that one gate electrode of adjacent gate electrodes out of the plurality of gate electrodes has a first edge side which includes a first overlap part placed on the second region, and another gate electrode of the adjacent gate electrodes has a second edge side which faces the first edge side and includes a second overlap part placed on the second region.

According to the present invention, it is possible to reduce a leakage current between a source and a drain and moreover, it is possible to make it difficult to cause a short circuit between adjacent gate electrodes.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

(1) First Embodiment (1-1) Semiconductor Device

Figure 1:
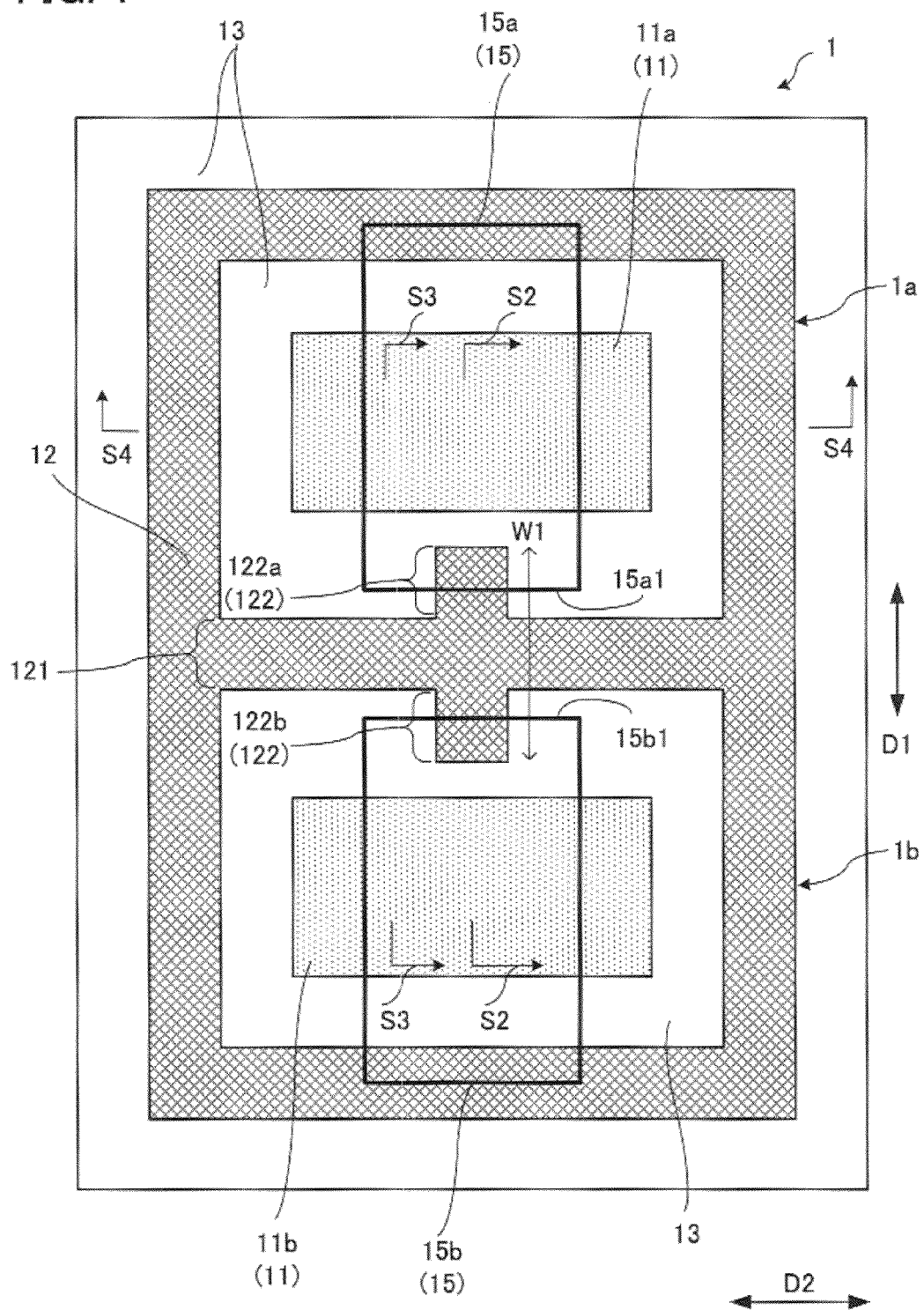
FIG. 1 is a plan view schematically illustrating a semiconductor device according to a first embodiment of the present invention.
Figure 2:
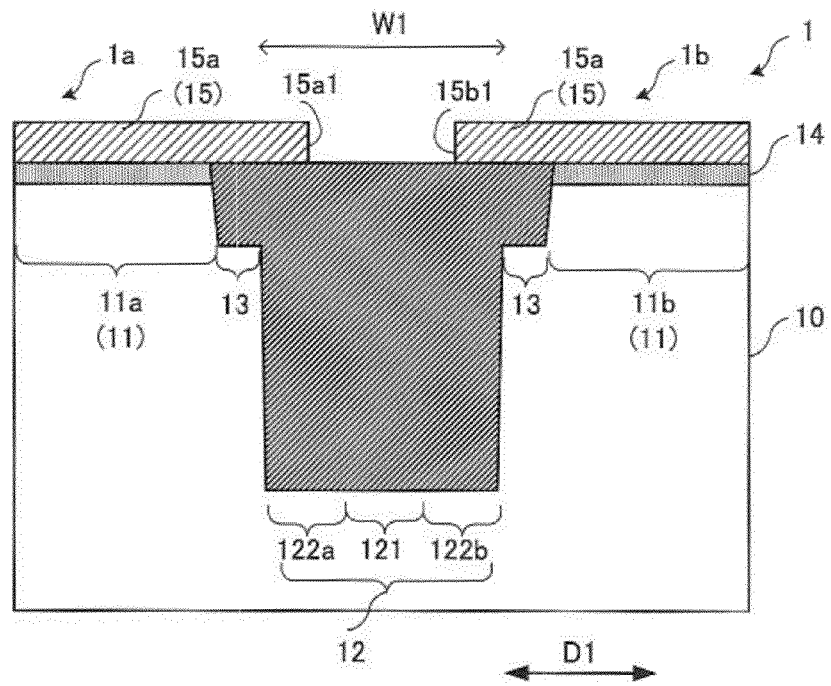
FIG. 2 is a longitudinal cross-sectional view schematically illustrating the semiconductor device taken along a plane indicated by a line S2-S2 in FIG. 1.
Figure 3:
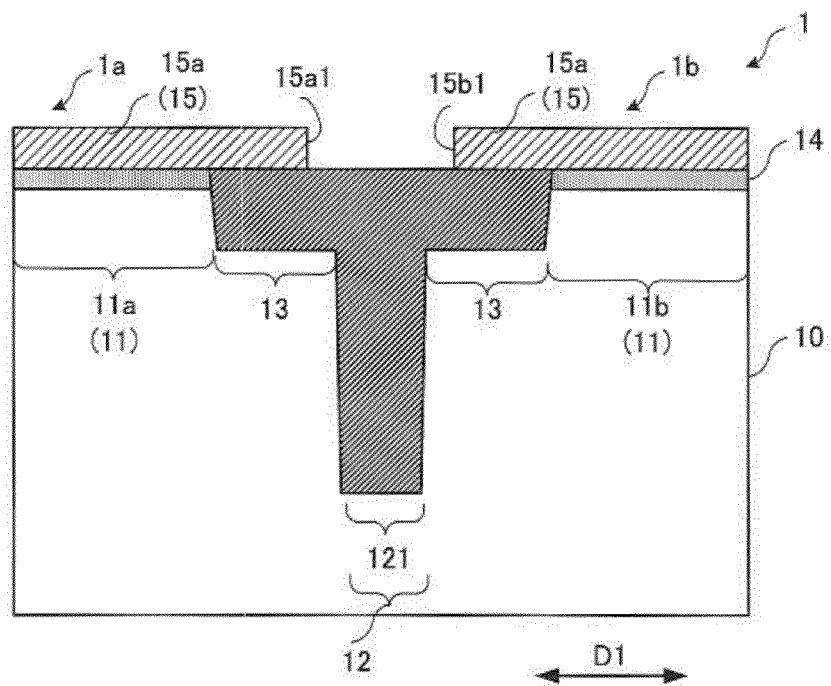
FIG. 3 is a longitudinal cross-sectional view schematically illustrating the semiconductor device taken along a plane indicated by a line S3-S3 in FIG. 1.
Figure 4:
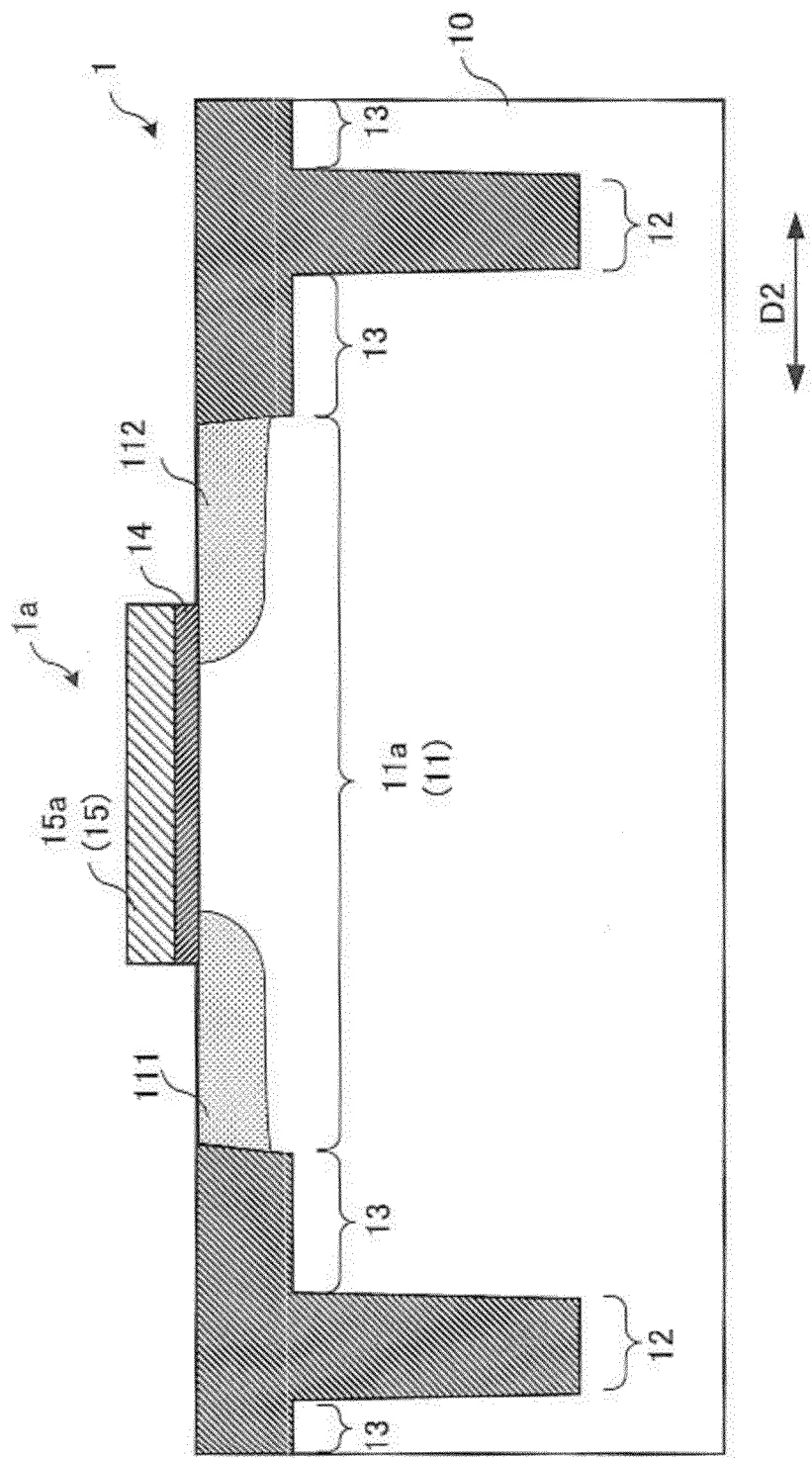
FIG. 4 is a longitudinal cross-sectional view schematically illustrating the semiconductor device taken along a plane indicated by a line S4-S4 in FIG. 1.

FIG. 1 is a plan view schematically illustrating a semiconductor device 1 according to the first embodiment. FIG. 1 illustrates an example in which the semiconductor device 1 includes two semiconductor elements 1a and 1b. The semiconductor elements 1a and 1b are MOS transistors, for example. FIG. 2 is a longitudinal cross-sectional view schematically illustrating the semiconductor device 1 taken along a plane indicated by a line S2-S2 in FIG. 1. FIG. 3 is a longitudinal cross-sectional view schematically illustrating the semiconductor device 1 taken along a plane indicated by a line S3-S3 in FIG. 1. FIG. 4 is a longitudinal cross-sectional view schematically illustrating the semiconductor device 1 taken along a plane indicated by a line S4-S4 in FIG. 1.

Figure 5:
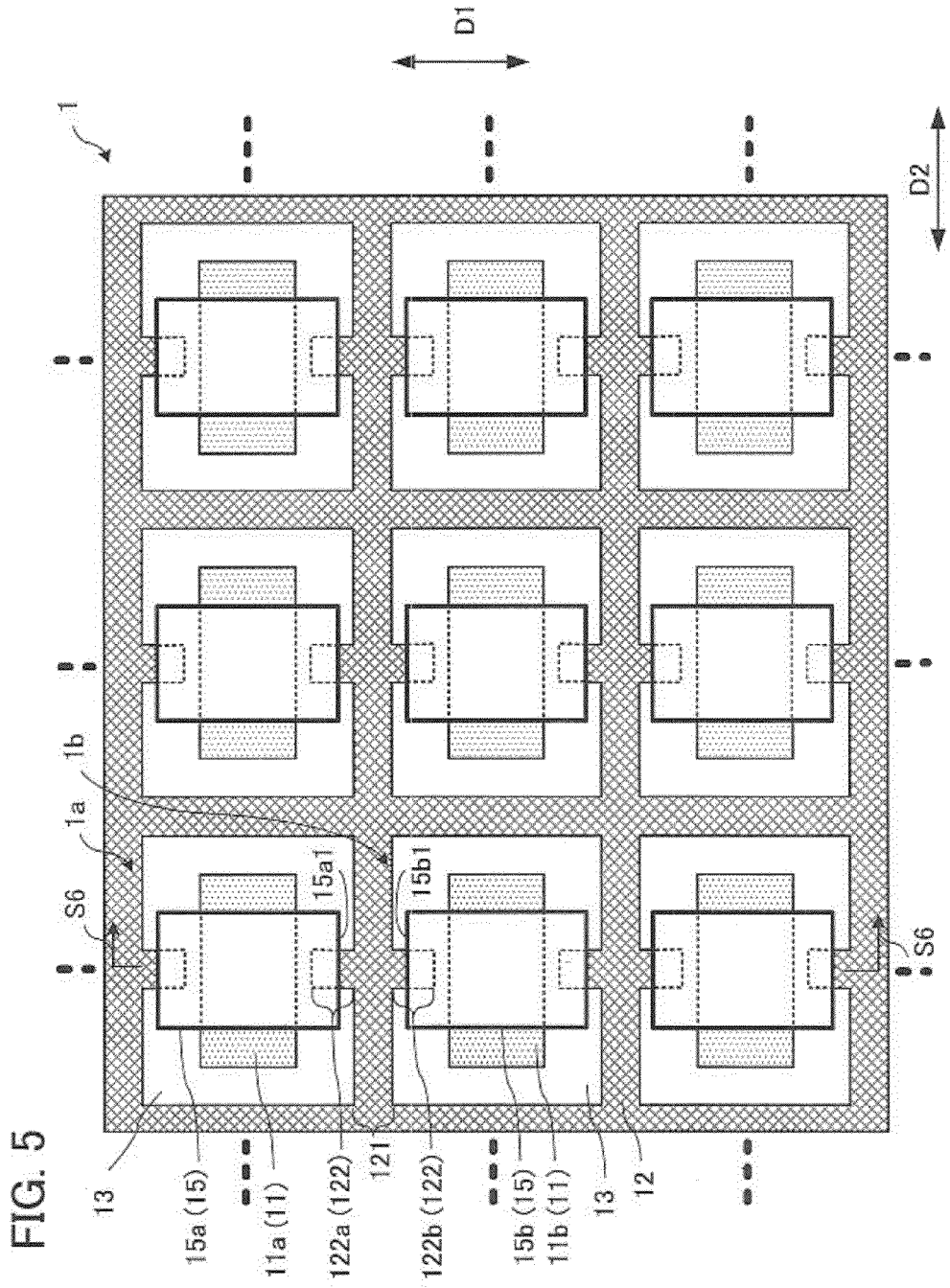
FIG. 5 is a plan view schematically illustrating the semiconductor device according to the first embodiment.
Figure 6:
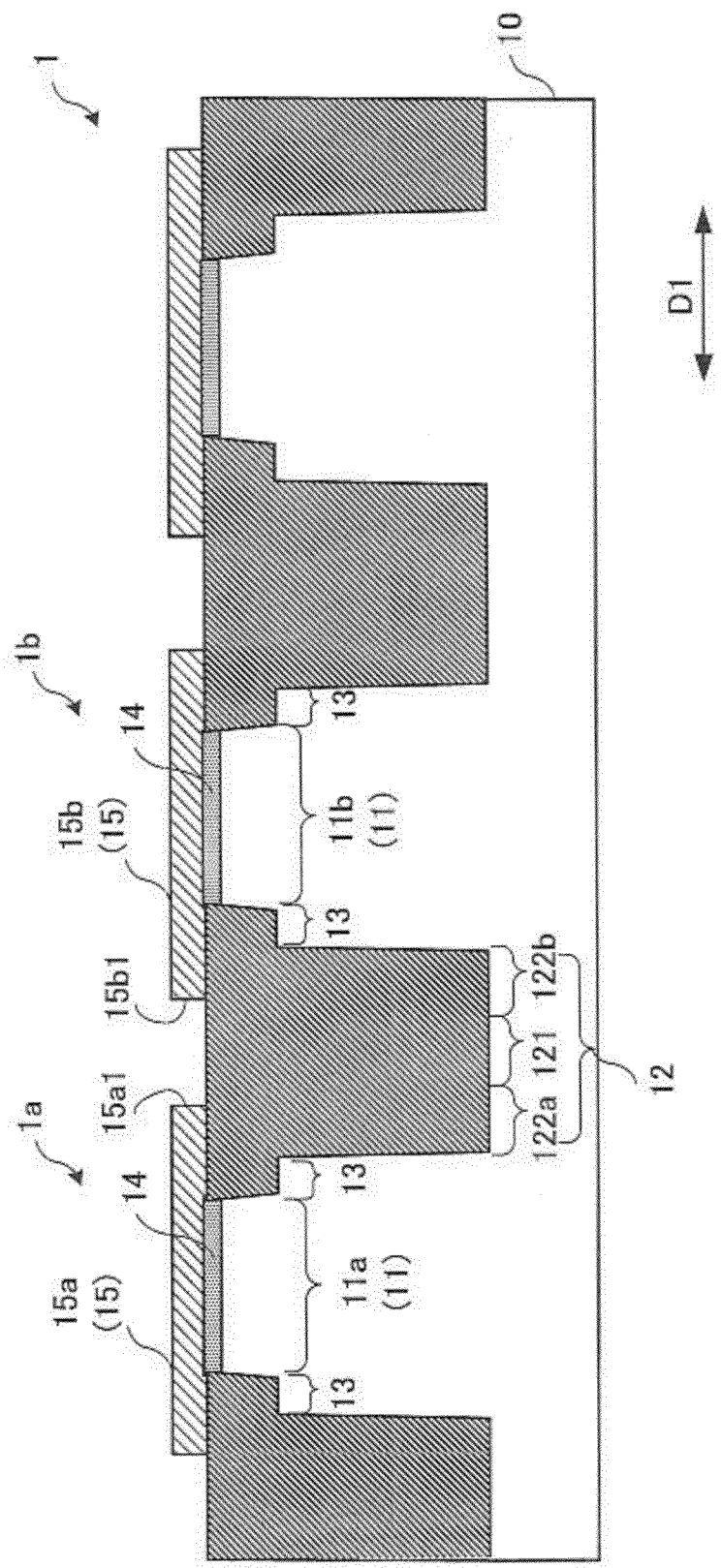
FIG. 6 is a longitudinal cross-sectional view schematically illustrating the semiconductor device taken along a plane indicated by a line S6-S6 in FIG. 5.

FIG. 5 is a plan view schematically illustrating the semiconductor device 1 according to the first embodiment. FIG. 5 illustrates an example in which a plurality of semiconductor elements is arranged like a matrix on a silicon wafer as a semiconductor substrate 10. FIG. 6 is a longitudinal cross-sectional view schematically illustrating the semiconductor device 1 taken along a plane indicated by a line S6-S6 in FIG. 5.

As illustrated in FIGS. 1 to 6, the semiconductor device 1 according to the first embodiment has a plurality of active regions 11 (or 11a, 11b), a first element isolating region 12 (or 121, 122; or 121, 122a, 122b), a second element isolating region 13, gate insulating films 14 (or 14a, 14b), and gate electrodes 15 (or 15a, 15b), in or on a semiconductor substrate 10.

As illustrated in FIG. 1 or 5, the plurality of active regions 11 are formed in the semiconductor substrate 10 and are arranged in a first direction D1 which is parallel to a surface of the semiconductor substrate 10 (e.g. a horizontal plane in FIG. 2). The first element isolating region 12 is formed in the semiconductor substrate 10 and electrically isolates the adjacent active regions 11a and 11b out of the plurality of active regions 11 from each other. The second element isolating region 13 is formed between the first element isolating region 12 and the active region 11, in the semiconductor substrate 10.

The gate electrode 15 is formed on the surface of the semiconductor substrate 10 so that the gate insulating film 14 is sandwiched between the gate electrode and the semiconductor substrate. The gate electrode 15 is formed so as to extend over the active region 11 in the first direction D1. The plurality of gate electrodes 15 are formed so as to be arranged in the first direction D1. As illustrated in FIGS. 2 to 4 and FIG. 6, the first and second element isolating regions 12 and 13 are formed so that a depth of the second element isolating region 13 is less than a depth of the first element isolating region 12. The first element isolating region 12 is a deep trench isolation (DTI) region. The second element isolating region 13 is a shallow trench isolation (STI) region.

As illustrated in FIG. 1, the first element isolating region 12 includes a first region 121 and a second region 122 between the adjacent active regions 11a and 11b. The first region 121 extends in a second direction D2 which is parallel to the surface of the semiconductor substrate 10 and orthogonal to the first direction D1. The second region 122 extends in a direction which is parallel to the surface of the semiconductor substrate 10 and intersects the first region 121. In the first embodiment, the second region 122 of the first element isolating region 12 includes a first protrusion part 122a and a second protrusion part 122b. The first protrusion part 122a protrudes toward the active region 11a which is one of the adjacent active regions 11a and 11b. The second protrusion part 122b protrudes toward the active region 11b which is the other one of the adjacent active regions 11a and 11b. The first and second protrusion parts 122a and 122b are linearly arranged, i.e., arranged in a line, in the first direction D1. The first and second protrusion parts 122a and 122b protrude in opposite directions from opposite sides of the first region 121 respectively.

In the first embodiment, as illustrated in FIG. 1, the plurality of gate electrodes 15 include adjacent gate electrodes 15a and 15b. The gate electrode 15a which is one of the adjacent gate electrodes 15a and 15b has a first edge side 15a1. The first edge side 15a1 is formed so as to include a first overlap part which is placed on the first protrusion part 122a (i.e., a part which overlaps with the first protrusion part 122a). The gate electrode 15b which is the other one of the adjacent gate electrodes 15a and 15b has a second edge side 15b1 which faces the first edge side 15a1. The second edge side 15b1 is formed so as to include a second overlap part which is placed on the second protrusion part 122b (i.e., a part which overlaps with the second protrusion part 122b). In addition, although the gate electrode 15 in FIG. 1 has a rectangular shape, a shape other than the rectangular shape may be also used.

In a case where the first and second protrusion parts 122a and 122b of the first element isolating region 12 are formed so as to reach the active regions 11 beyond the second element isolating regions 13, there is a risk that the first and second protrusion parts 122a and 122b may influence on properties of a transistor as the semiconductor element 1a or 1b. However, by including the second element isolating region 13 so as to surround the first element isolating region 12, i.e., by using the structure where the DTI region is surrounded by the STI region, an influence of the first and second protrusion parts 122a and 122b of the first element isolating region 12 on the transistor properties is reduced.

In the first embodiment, if the semiconductor elements 1a and 1b are MOS transistors, a source region 111 and a drain region 112 are formed in the active region 11, as illustrated in FIG. 4.

(1-2) Manufacturing Method

Figure 10:
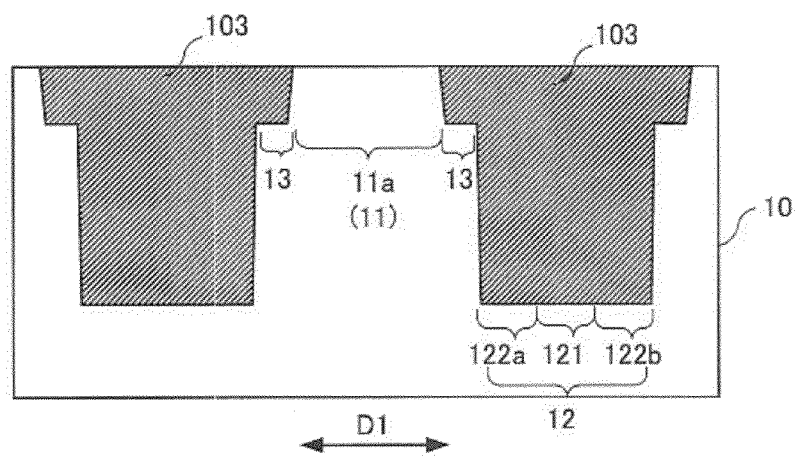
FIG. 10 is a longitudinal cross-sectional view schematically illustrating a process of the method of manufacturing the semiconductor device according to the first embodiment.
Figure 11:
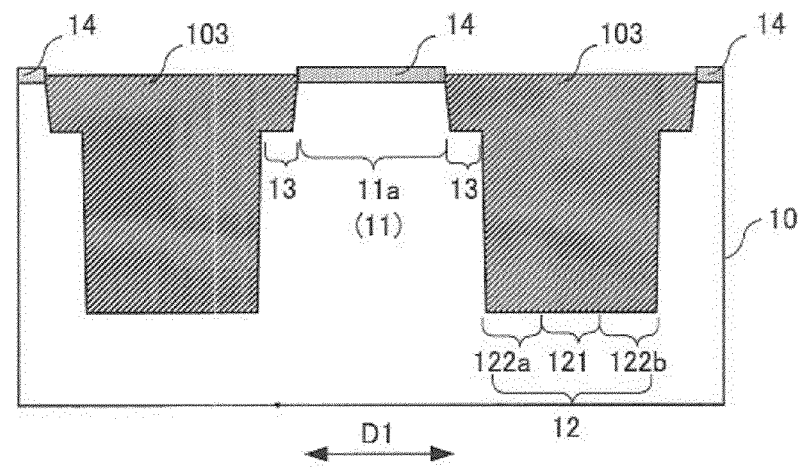
FIG. 11 is a longitudinal cross-sectional view schematically illustrating a process of the method of manufacturing the semiconductor device according to the first embodiment.
Figure 12A:
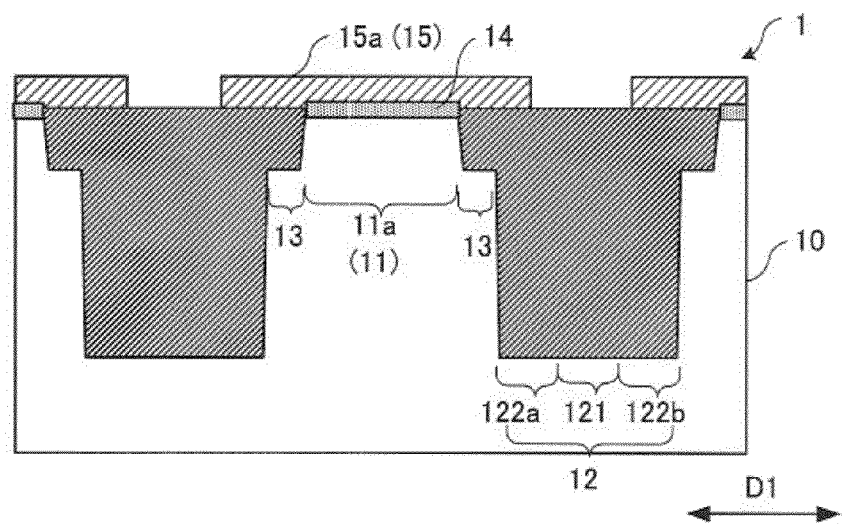
FIGS. 12A and 12B are longitudinal cross-sectional views schematically illustrating a process of the method of manufacturing the semiconductor device according to the first embodiment.
Figure 12B:
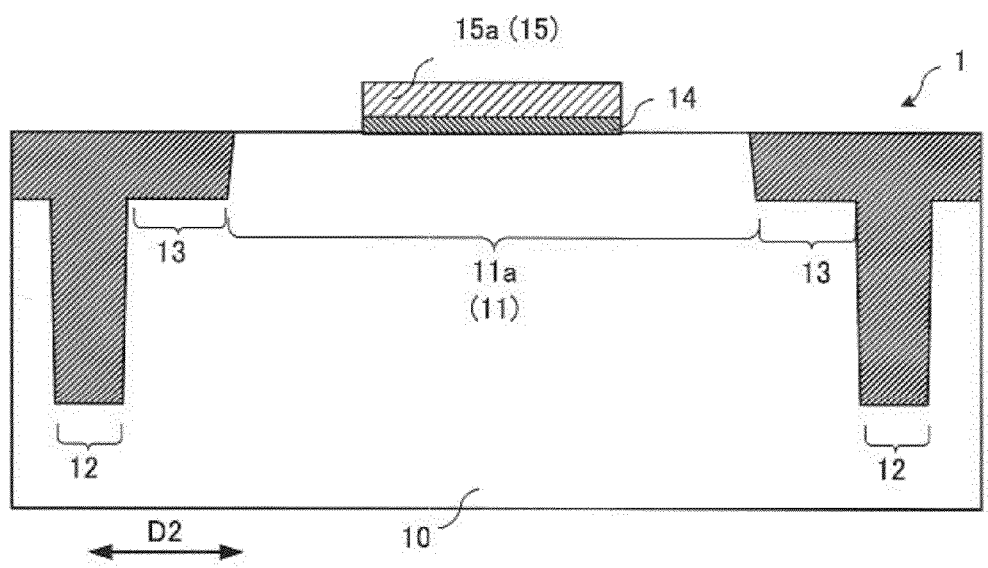
Figure 13:
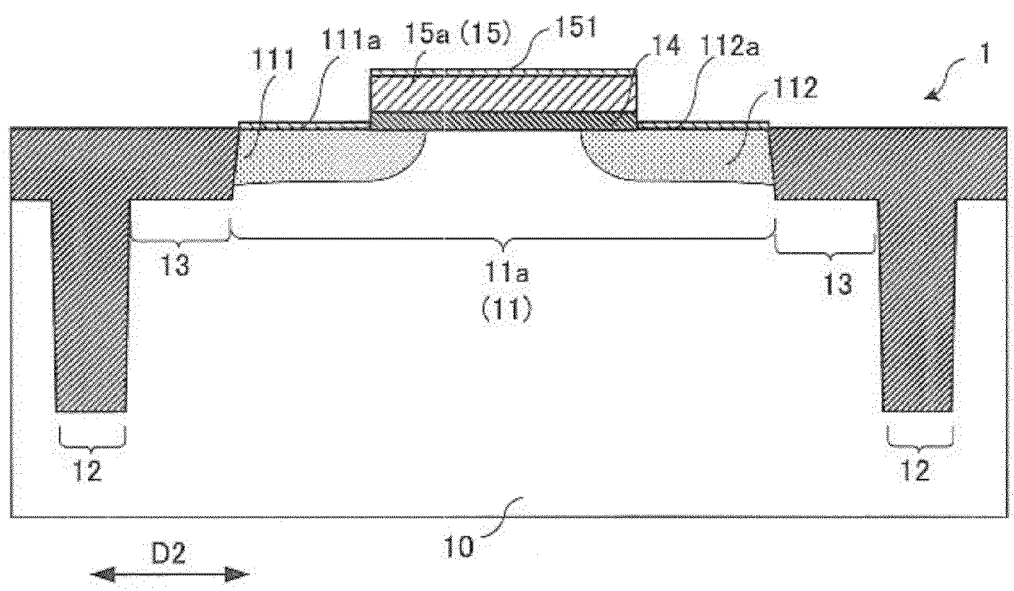
FIG. 13 is a longitudinal cross-sectional view schematically illustrating a process of the method of manufacturing the semiconductor device according to the first embodiment.
Figure 14:
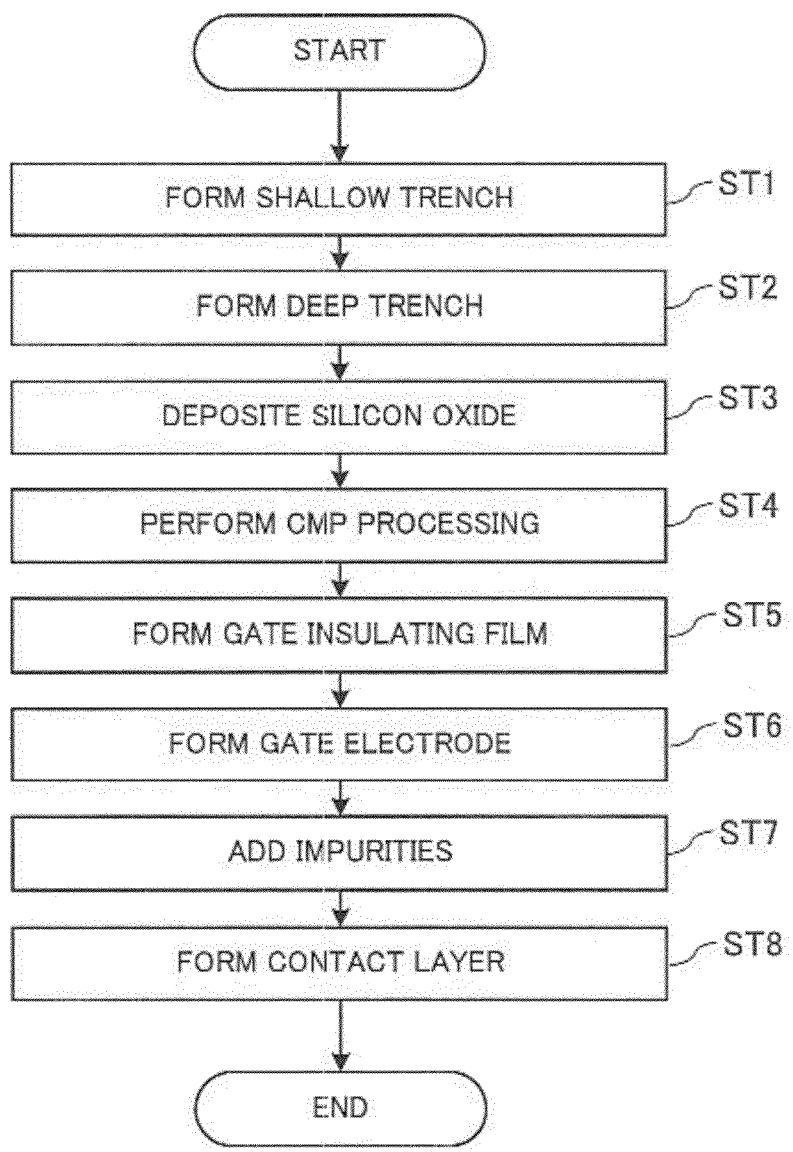
FIG. 14 is a flowchart illustrating the method of manufacturing the semiconductor device according to the first embodiment.

FIGS. 7 to 11, FIGS. 12A and 12B and FIG. 13 are schematic longitudinal cross-sectional views illustrating processes of a method of manufacturing the semiconductor device 1 according to the first embodiment. FIG. 14 is a flowchart illustrating the method of manufacturing the semiconductor device according to the first embodiment. FIGS. 7 to 11 and FIG. 12A illustrate the semiconductor device 1 taken along the plane indicated by the line S4-S4 in FIG. 1 (i.e., the semiconductor device 1 taken along the plane indicated by the line S6-S6 in FIG. 5). FIGS. 12B and 13 illustrate the semiconductor device 1 taken along the plane indicated by the line S4-S4 in FIG. 1.

Figure 7:
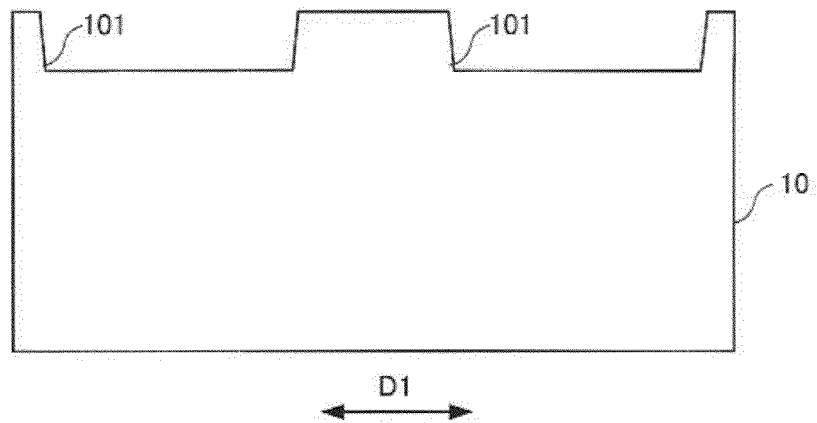
FIG. 7 is a longitudinal cross-sectional view schematically illustrating a process of a method of manufacturing the semiconductor device according to the first embodiment.

In the first embodiment, first, as illustrated in FIG. 7, a shallow trench 101 is formed on the semiconductor substrate 10, by using photolithography technique and dry etching, for example (a step ST1 in FIG. 14).

Figure 8:
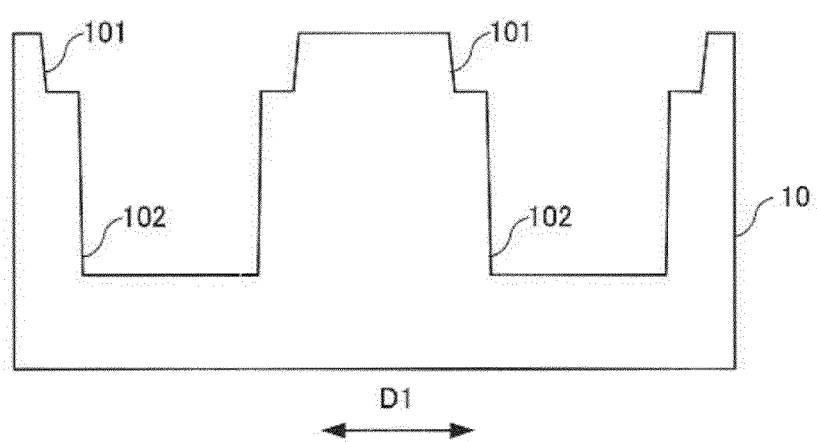
FIG. 8 is a longitudinal cross-sectional view schematically illustrating a process of the method of manufacturing the semiconductor device according to the first embodiment.

Next, as illustrated in FIG. 8, a deep trench 102 which is deeper than the shallow trench 101 is formed on the semiconductor substrate 10, by using photolithography technique and dry etching, for example (a step ST2 in FIG. 14).

Figure 9:
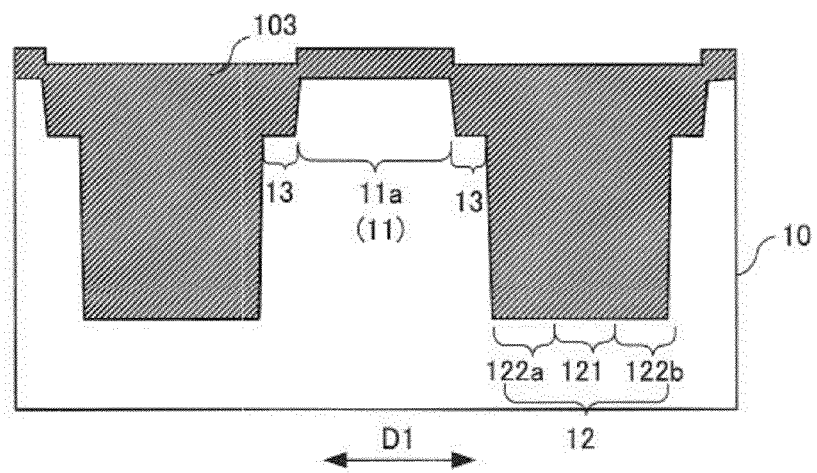
FIG. 9 is a longitudinal cross-sectional view schematically illustrating a process of the method of manufacturing the semiconductor device according to the first embodiment.

Next, as illustrated in FIG. 9, an insulating material such as polysilicon 103 is deposited on the semiconductor substrate 10 so as to fill the shallow trench 101 and the deep trench 102, by using a Chemical Vapor Deposition (CVD) method, for example (a step ST3 in FIG. 14).

Next, as illustrated in FIG. 10, the surface of the semiconductor substrate 10 (an upper surface in FIG. 10) with the polysilicon 103 is planarized or flattered by using a planarization process such as a Chemical Mechanical Polishing (CMP) method, for example (a step ST4 in FIG. 14).

Next, as illustrated in FIG. 11, the gate insulating film 14 is formed on the surface of the semiconductor substrate, by using thermal oxidation, for example (a step ST5 in FIG. 14). The gate insulating film 14 is a silicon oxide film, for example, and has a thickness of 800 angstroms in thickness, for example.

Next, as illustrated in FIGS. 12A and 12B, the gate electrode 15 is formed on the gate insulating film 14 on the surface of the semiconductor substrate 10, by using sputtering, photolithography technique and etching, for example (a step ST6 in FIG. 14). The gate electrode 15 is formed of a conductive material such as polysilicon. At the time, the gate electrode 15 is formed so that both ends of the gate electrode 15 in the first direction D1 are placed on the first element isolating regions 12.

Next, as illustrated in FIG. 13, the source region 111 and the drain region 112 which are low concentration diffusion layers are formed in the active region 11 by implanting impurities (ion implantation) (a step ST7 in FIG. 14). The impurities are phosphorus, for example.

Next, a contact layer 111a of the source region 111, a contact layer 112a of the drain region 112 and a contact layer 151 of the gate electrode 15 are formed, by using sputtering, photolithography technique and etching, for example (a step ST8 in FIG. 14).

(1-3) First Comparative Example

Figure 15:
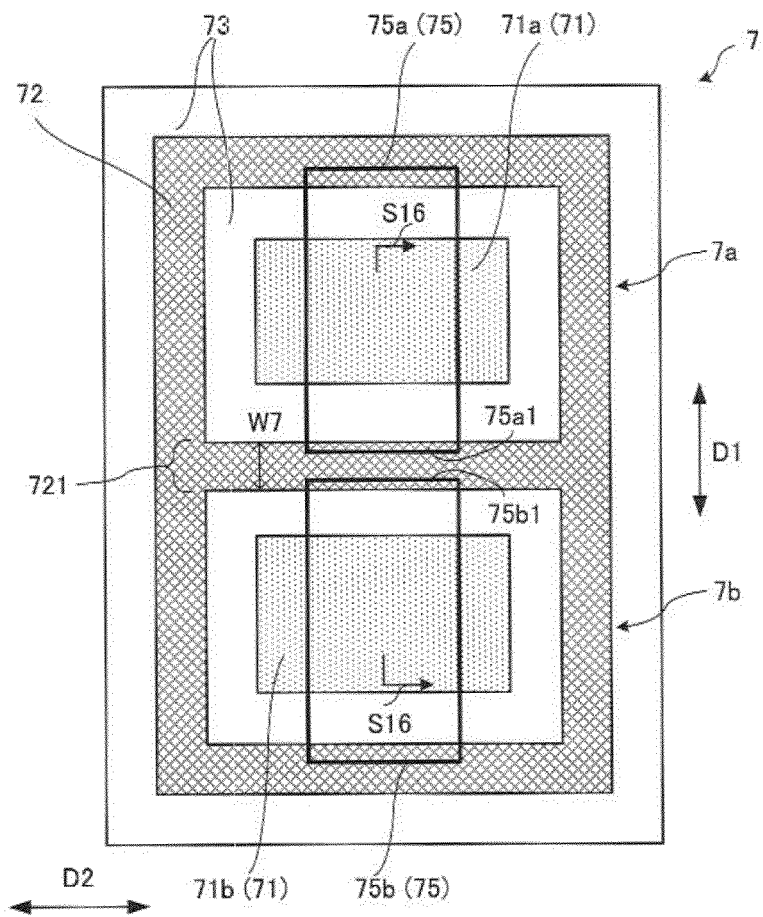
FIG. 15 is a plan view schematically illustrating a semiconductor device of a first comparative example.
Figure 16:
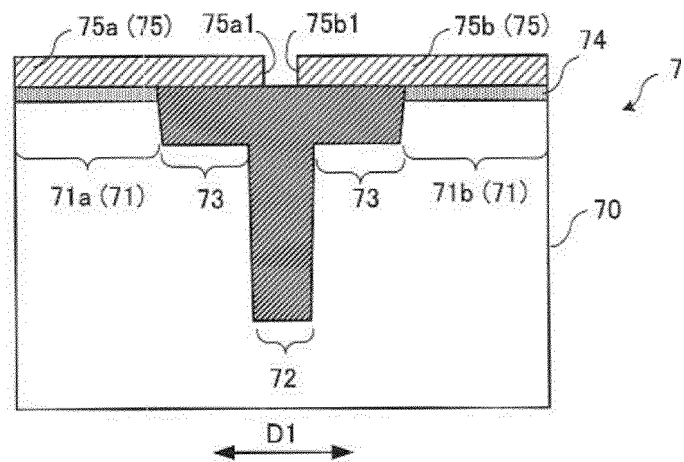
FIG. 16 is a longitudinal cross-sectional view schematically illustrating the semiconductor device taken along a plane indicated by a line S16-S16 in FIG. 15.

FIG. 15 is a plan view schematically illustrating a semiconductor device 7 in a first comparative example. FIG. 16 is a longitudinal cross-sectional view schematically illustrating the semiconductor device 7 taken along a plane indicated by a line S16-S16 in FIG. 15. A first element isolating region 72 in the semiconductor device 7 in the first comparative example does not have the first and second protrusion parts 122a and 122b, and the first element isolating region 72 differs from the first element isolating region 12 in the first embodiment in this point. As illustrated in FIGS. 15 and 16, in the first comparative example, the semiconductor device 7 (or 7a, 7b) has a semiconductor substrate 70, active regions 71 (or 71a, 71b), the first element isolating region 72 which is a DTI region, a second element isolating region 73 which is a STI region, gate insulating films 74 (or 74a, 74b), and gate electrodes 75 (or 75a, 75b).

As illustrated in FIG. 15 or 16, in the first comparative example, the first element isolating region 72 is formed in the semiconductor substrate 70 and electrically isolates the adjacent active regions 71a and 71b from each other. The second element isolating region 73 is formed in the semiconductor substrate 70. The second element isolating region 73 is formed between the first element isolating region 72 and the active regions 71 so as to surround the first element isolating region 72. The gate electrode 75 is formed on a surface of the semiconductor substrate 70 so that the gate insulating film 74 is sandwiched between the gate electrode and the semiconductor substrate. The gate electrode 75 is formed so as to extend over the active region 71. Moreover, as illustrated in FIG. 15 or 16, in the first comparative example, the gate electrodes 75 include adjacent gate electrodes 75a and 75b. The gate electrode 75a which is one of the adjacent gate electrodes has an edge side 75a1. The edge side 75a1 is formed so as to include a first overlap part which is placed on a line-shaped region 721 of the first element isolating region 72. The gate electrode 75b which is the other one of the adjacent gate electrodes has an edge side 75b1 which faces the edge side 75a1. The edge side 75b1 is formed so as to include a second overlap part which is placed on the line-shaped region 721 of the first element isolating region 72.

Figure 17:
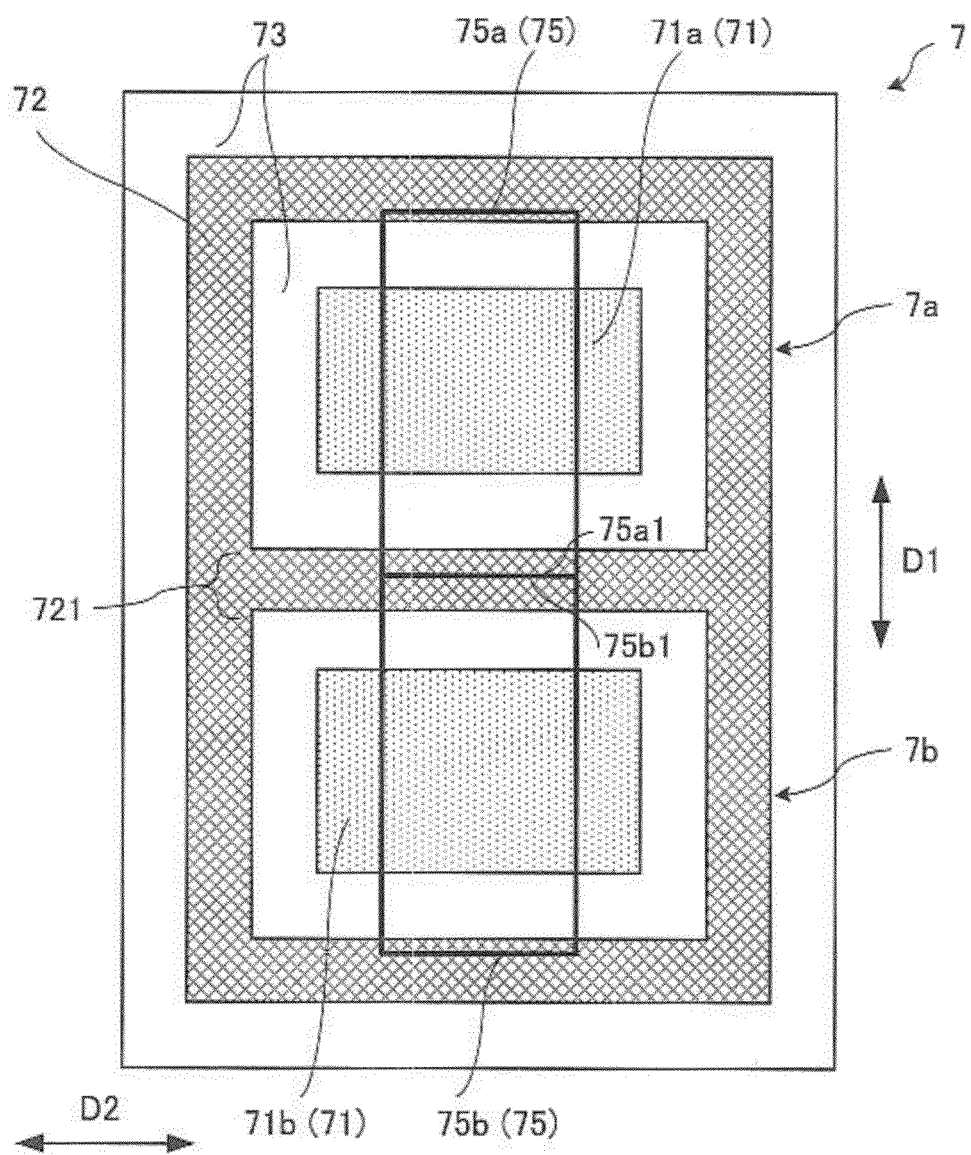
FIG. 17 is a plan view schematically illustrating the semiconductor device in the first comparative example.

In the first comparative example, it is required to place the edge side 75a1 of the gate electrode 75a and the edge side 75b1 of the gate electrode 75b on the line-shaped region 721 of the first element isolating region 72 so as not to touch each other. However, since a width W7 of the line-shaped region 721 of the first element isolating region 72 is extremely small for achieving high integration, if the edge side 75a1 of the gate electrode 75a or the edge side 75b1 of the gate electrode 75b is placed at a slightly different position from an appropriate position, a short circuit easily occurs between the adjacent gate electrodes 75a and 75b, i.e., the edge sides 75a1 and 75b1 easily touch each other, as illustrated in FIG. 17.

(1-4) Second Comparative Example

Figure 18:
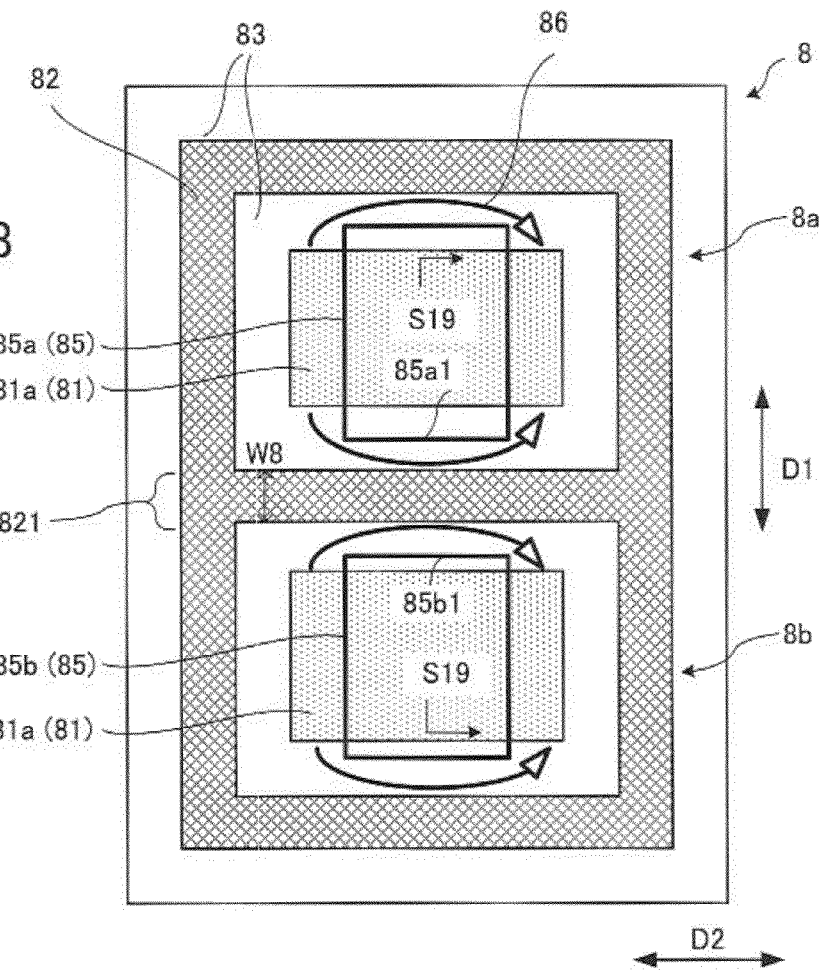
FIG. 18 is a plan view schematically illustrating a semiconductor device in a second comparative example.
Figure 19:
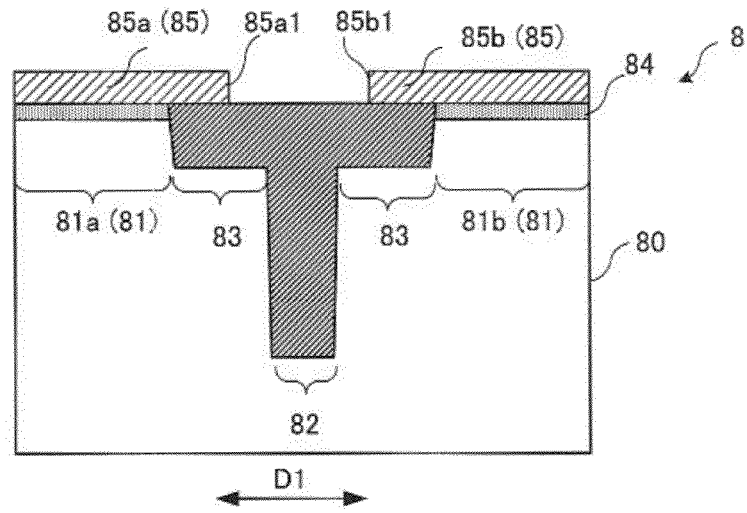
FIG. 19 is a longitudinal cross-sectional view schematically illustrating the semiconductor device taken along a plane indicated by a line S19-S19 in FIG. 18.

FIG. 18 is a plan view schematically illustrating a semiconductor device 8 in a second comparative example. FIG. 19 is a longitudinal cross-sectional view schematically illustrating the semiconductor device 8 taken along a plane indicated by a line S19-S19 in FIG. 18. A first element isolating region 82 in the semiconductor device 8 in the second comparative example does not have the first and second protrusion parts 122a and 122b, and the first element isolating region 82 differs from the first element isolating region 12 in the first embodiment in this point. As illustrated in FIGS. 18 and 19, the semiconductor device 8 (or 8a, 8b) in the second comparative example has a semiconductor substrate 80, active regions 81 (or 81a, 81b), the first element isolating region 82 which is a DTI region, a second element isolating region 83 which is a STI region, gate insulating films 84 (or 84a, 84b), and gate electrodes 85 (or 85a, 85b).

As illustrated in FIG. 18 or 19, in the second comparative example, the first element isolating region 82 electrically isolates the adjacent active regions 81a and 81b from each other. The second element isolating region 83 is formed between the first element isolating region 82 and the active region 81. The gate electrode 85 is formed on a surface of the semiconductor substrate 80 so that the gate insulating film 84 is sandwiched between the gate electrode and the semiconductor substrate. The gate electrode 85 is formed so as to extend over the active region 81. Moreover, as illustrated in FIG. 18 or 19, in the second comparative example, the gate electrodes 85 include gate electrodes 85a and 85b. The gate electrode 85a which is one of the gate electrodes has an edge side 85a1. The edge side 85a1 is formed so as to include a first overlap part which is placed on a line-shaped region 821 of the first element isolating region 82. The gate electrode 85b which is the other one of the gate electrodes has an edge side 85b1 which faces the edge side 85a1. The edge side 85b1 is formed so as to include a second overlap part which is placed on the line-shaped region 821 of the first element isolating region 82.

In the second comparative example, it is required to place the edge side 85a1 of the gate electrode 85a and the edge side 85b1 of the gate electrode 85b on the line-shaped region 821 of the first element isolating region 82 so as not to touch each other. However, since a width W8 of the line-shaped region 821 of the first element isolating region 82 is extremely small for achieving high integration, if the edge side 85a1 of the gate electrode 85a and the edge side 85b1 of the gate electrode 85b are placed at a slightly different position from appropriate positions, the edge sides 85a1 and 85b1 may be placed on the second element isolating region 83, as illustrated in FIG. 19. In such a case, since a channel stopper region is not formed under the second element isolating region 83 which is a STI region, a leakage current flows between a source and a drain as indicated by arrows 86 in FIG. 18, and thus the semiconductor elements 8a and 8b lose desired properties.

(1-5) Advantageous Effects of First Embodiment

In the first embodiment, the first element isolating region 12 includes the first region 121 extending in the second direction D2, and the second region 122 extending in the first direction D1 which intersects the first region 121, between the adjacent active regions 11a and 11b. The second region 122 includes the first protrusion part 122a which protrudes toward the active region 11a, and the second protrusion part 122b which protrudes toward the active region 11b. The first and second protrusion parts 122a and 122b are linearly arranged in the first direction D1 and protrude in opposite directions from opposite sides of the first region 121 respectively. Thus, in the first embodiment, it is effective to form the first edge side 15a1 of the gate electrode 15a and the second edge side 15b1 of the gate electrode 15b within a range of a width W1 which corresponds to a width of the first region 121 and a width of the second region 122 (the first and second protrusion parts 122a and 122b) so that no short circuit occurs between the adjacent gate electrodes. The width W1 illustrated in FIG. 1 is wider than the width W7 of the line-shaped region 721 of the first element isolating region 72 in the first comparative example, by a width of the first protrusion part 122a and a width of the second protrusion part 122b. Moreover, the width W1 is wider than the width W8 of the line-shaped region 821 of the first element isolating region 82 in the second comparative example, by the width of the first protrusion part 122a and the width of the second protrusion part 122b. Therefore, at a time of manufacturing of the semiconductor device 1, even if the edge side 15a1 of the gate electrode 15a or the edge side 15b1 of the gate electrode 15b is placed at a slightly different position from an appropriate position, it is possible to reduce a problem that a short circuit occurs between the edge sides 15a1 and 15b1, or a problem that the edge side 15a1 or 15b1 is not placed on the first element isolating region 12.

Moreover, according to the first embodiment, cost can be reduced, in comparison with a case where the first element isolating region 12 is simply formed within the line-shaped region of the width W1, because the insulating material forming the first element isolating region 12 can be saved.

(1-6) Modified Example of First Embodiment

Figure 20:
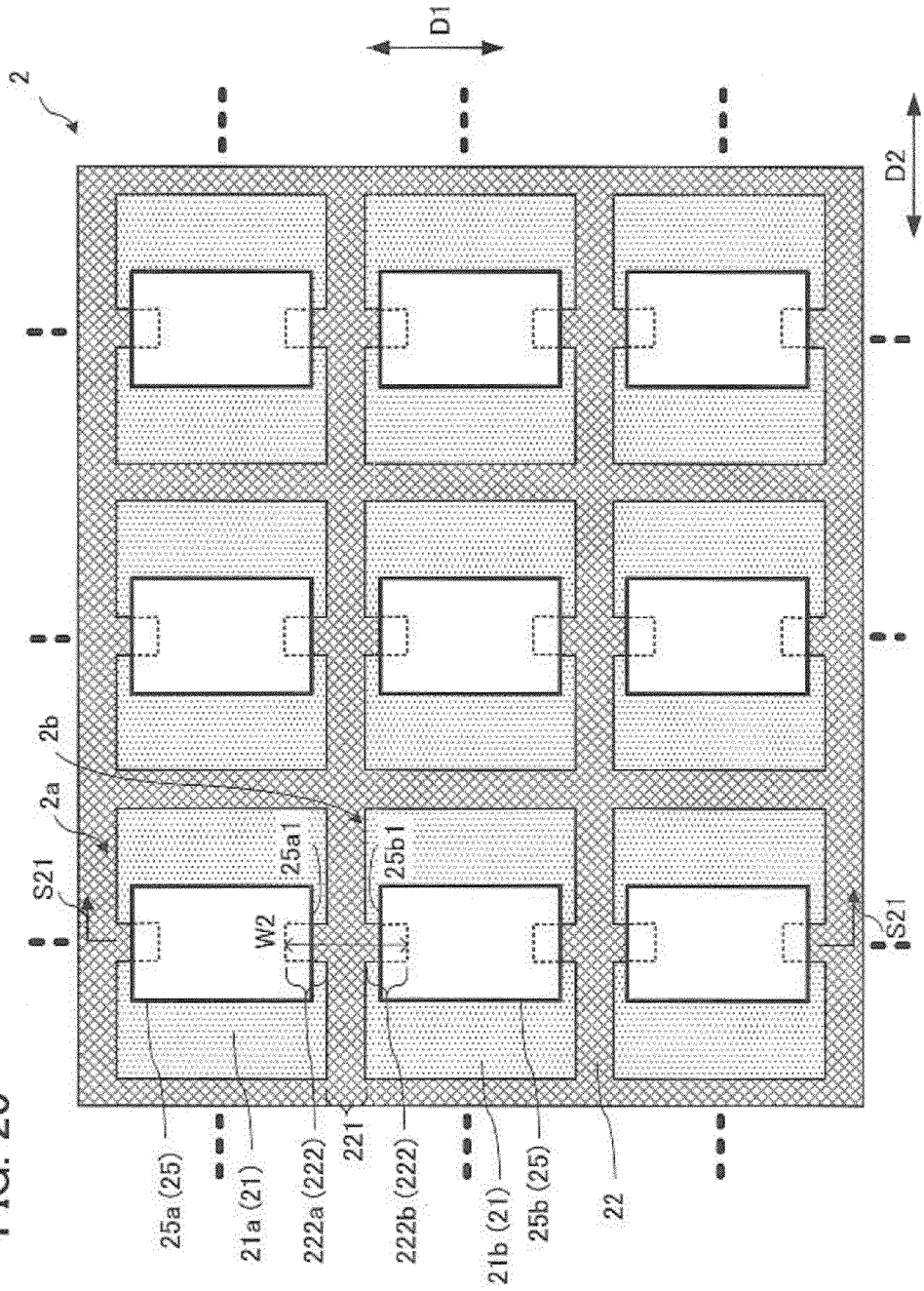
FIG. 20 is a plan view schematically illustrating a semiconductor device according to a modified example of the first embodiment.
Figure 21:
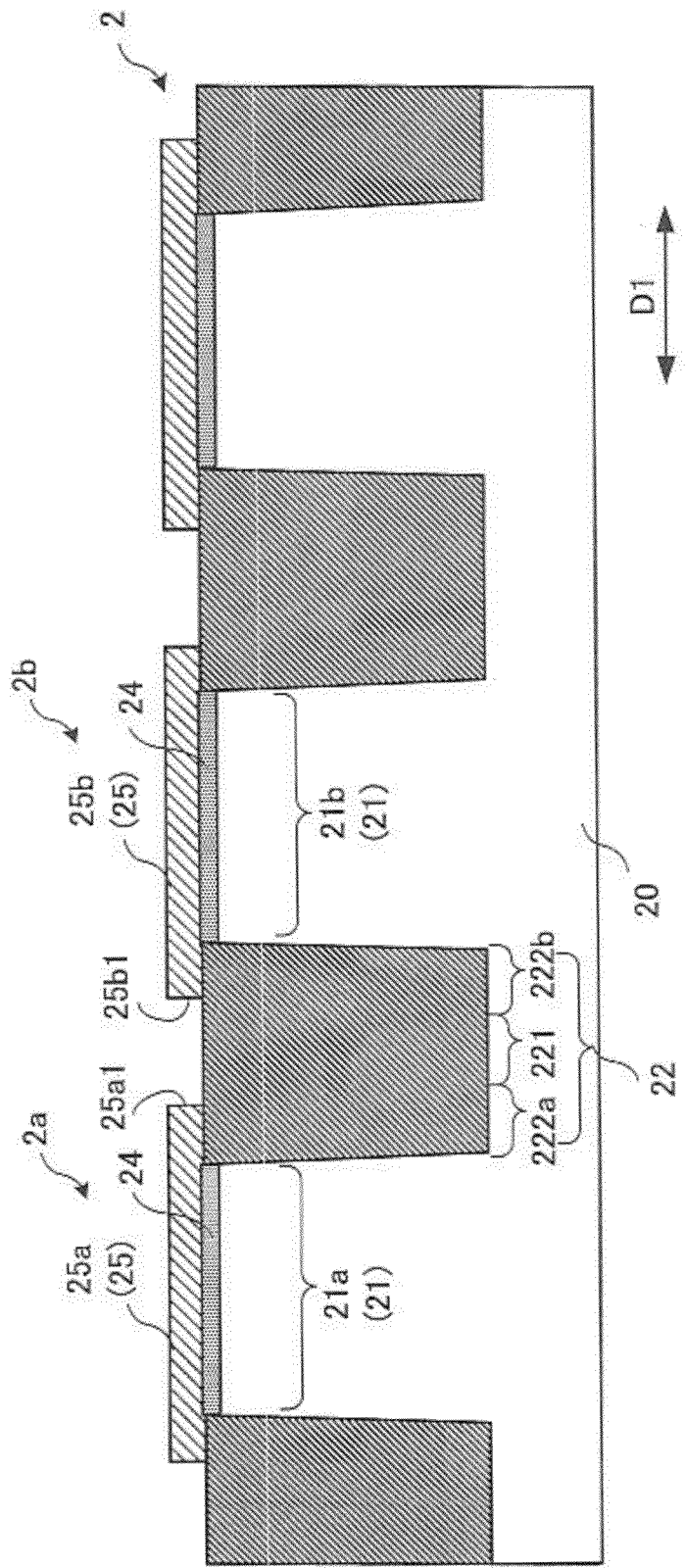
FIG. 21 is a longitudinal cross-sectional view schematically illustrating the semiconductor device taken along a plane indicated by a line S21-S21 in FIG. 20.

FIG. 20 is a plan view schematically illustrating a semiconductor device 2 according to a modified example of the first embodiment. FIG. 21 is a longitudinal cross-sectional view schematically illustrating the semiconductor device 2 taken along a plane indicated by a line S21-S21 in FIG. 20. As illustrated in FIGS. 20 and 21, in the modified example of the first embodiment, the semiconductor device 2 (or 2a, 2b) has a semiconductor substrate 20, active regions 21 (or 21a, 21b), a first element isolating region 22 which is a DTI region 22 (or 221, 222; or 221, 222a, 222b), gate insulating films 24 (or 24a, 24b), and gate electrodes 25 (or 25a, 25b). The semiconductor device 2 differs from the semiconductor device 1 of the first embodiment in a point that the semiconductor device 2 illustrated in FIGS. 20 and 21 does not have the second element isolating region 13.

As illustrated in FIG. 20 or 21, the plurality of active regions 21 is arranged like a matrix in the semiconductor substrate 20. The first element isolating region 22 is formed in the semiconductor substrate 20 and electrically isolates the adjacent active regions 21a and 21b out of the plurality of active regions 21 from each other. The gate electrode 25 is formed on a surface of the semiconductor substrate 20 so that the gate insulating film 24 is sandwiched between the gate electrode and the semiconductor substrate. The gate electrode 25 is formed so as to extend over the active region 21. The plurality of gate electrodes 25 is formed so as to be aligned in the first direction D1.

As illustrated in FIG. 20, the first element isolating region 22 includes a first region 221 and a second region 222 between the adjacent active regions 21a and 21b. The first region 221 extends in the second direction D2 which is parallel to the surface of the semiconductor substrate 20 and orthogonal to the first direction D1. The second region 222 extends in a direction which is parallel to the surface of the semiconductor substrate 20 and intersects the first region 221. In the modified example of the first embodiment, the second region 222 of the first element isolating region 22 includes a first protrusion part 222a and a second protrusion part 222b. The first protrusion part 222a protrudes toward the active region 21a which is one of the adjacent active regions 21a and 21b. The second protrusion part 222b protrudes toward the active region 21b which is the other one of the adjacent active regions 21a and 21b. The first and second protrusion parts 222a and 222b are linearly arranged in the first direction D1 and protrude in opposite directions from opposite sides of the first region 221 respectively.

Moreover, as illustrated in FIG. 20, in the modified example of the first embodiment, the gate electrodes 25 include the gate electrodes 25a and 25b. The gate electrode 25a has a first edge side 25a1. The first edge side 25a1 is formed so as to include a first overlap part which is placed on the first protrusion part 222a (i.e., a part which overlaps with the first protrusion part 222a). The gate electrode 25b is adjacent to the gate electrode 25a and has a second edge side 25b1 which faces the first edge side 25a1. The second edge side 25b1 is formed so as to include a second overlap part which is placed on the second protrusion part 222b (i.e., a part which overlaps with the second protrusion part 222b).

In the modified example of the first embodiment, it is effective to form the first edge side 25a1 of the gate electrode 25a and the second edge side 25b1 of the gate electrode 25b within a range of a width W2 which corresponds to a width of the first region 221 and a width of the second region 222 (the first and second protrusion parts 222a and 222b) so that no short circuit occurs between the adjacent gate electrodes. The width W2 is wider than the width W7 in the first comparative example and wider than the width W8 in the second comparative example. Therefore, even if the edge side 25a1 of the gate electrode 25a or the edge side 25b1 of the gate electrode 25b is placed at a slightly different position from an appropriate position, it is possible to reduce a problem that a short circuit occurs between the edge sides 25a1 and 25b1, or a problem that the edge side 25a1 or 25b1 is not placed on the first element isolating region 22.

Moreover, in the modified example of the first embodiment, the semiconductor device 2 does not have the second element isolating region 13, i.e., does not use the structure where a DTI region is surrounded by a STI region. Therefore, the semiconductor device 2 has a simple structure and its manufacturing processes are also simple.

The modified example of the first embodiment may be applied to a case where the first and second protrusion parts 222a and 222b of the first element isolating region 22 slightly influence transistor properties, or a case where a slight difference in transistor properties is permitted in a use of the transistor.

(2) Second Embodiment (2-1) Semiconductor Device and Manufacturing Method

Figure 22:
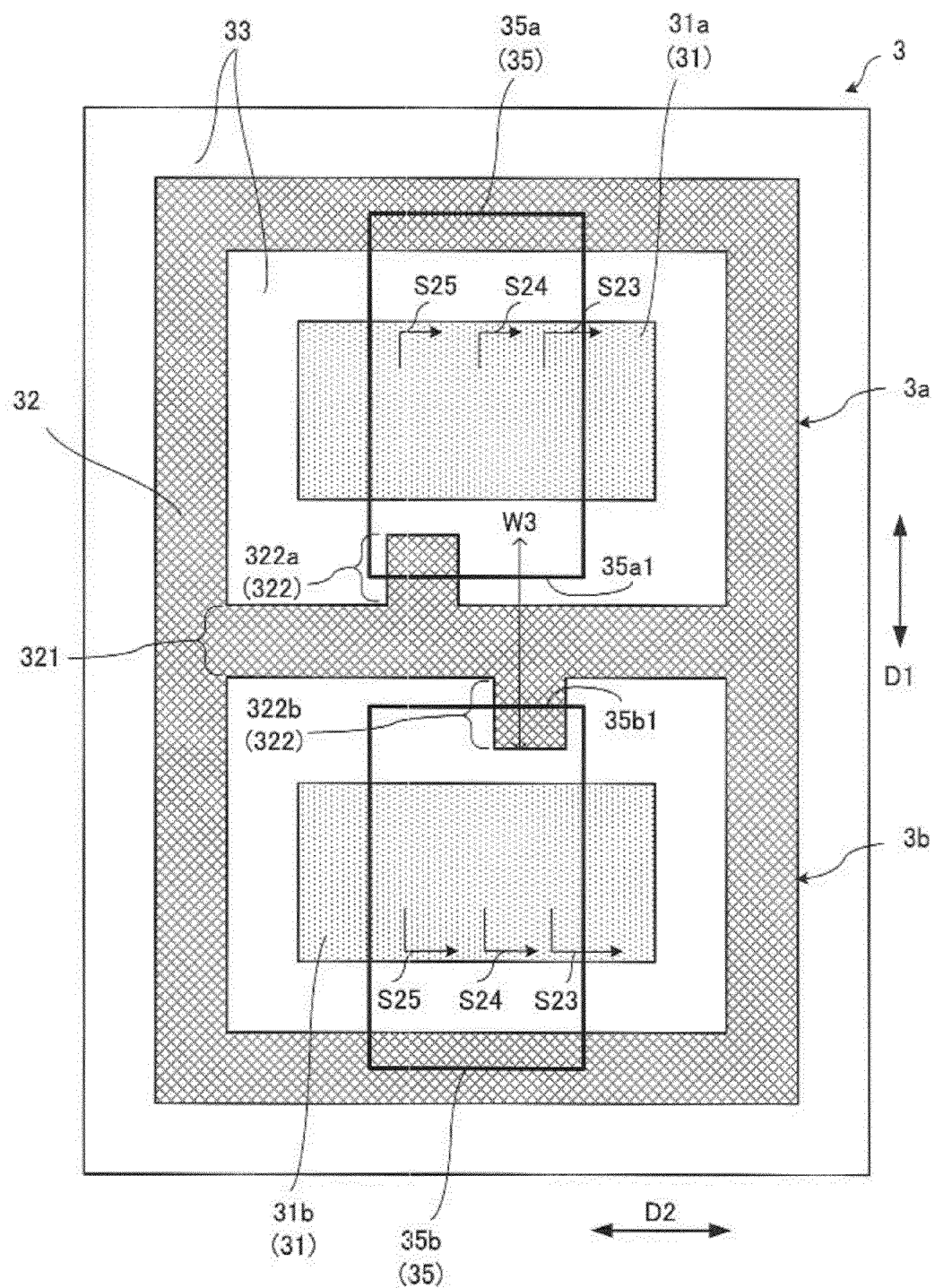
FIG. 22 is a plan view schematically illustrating a semiconductor device according to a second embodiment of the present invention.
Figure 23:
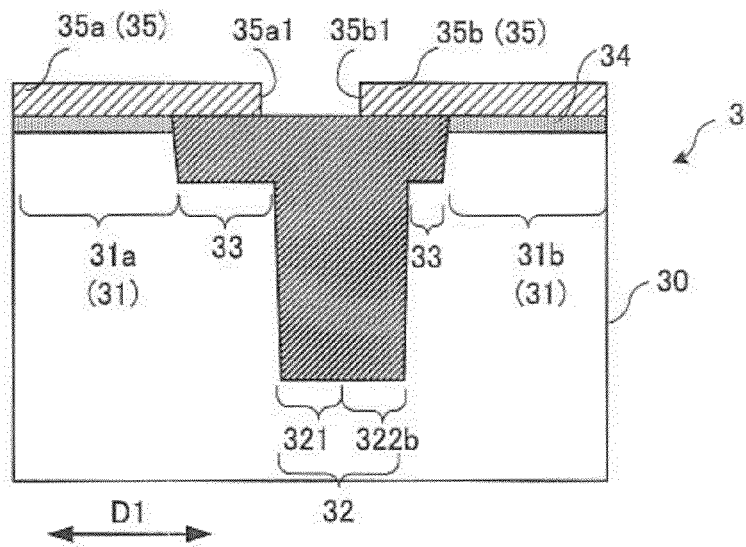
FIG. 23 is a longitudinal cross-sectional view schematically illustrating the semiconductor device taken along a plane indicated by a line S23-S23 in FIG. 22.
Figure 24:
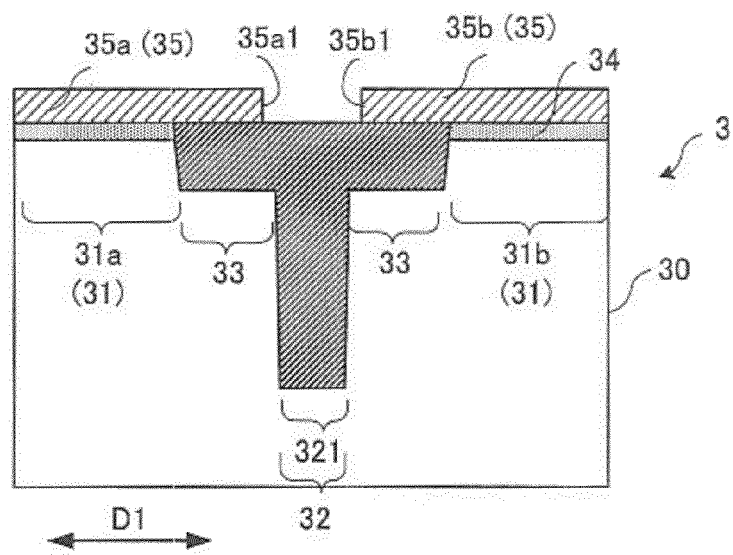
FIG. 24 is a longitudinal cross-sectional view schematically illustrating the semiconductor device taken along a plane indicated by a line S24-S24 in FIG. 22.
Figure 25:
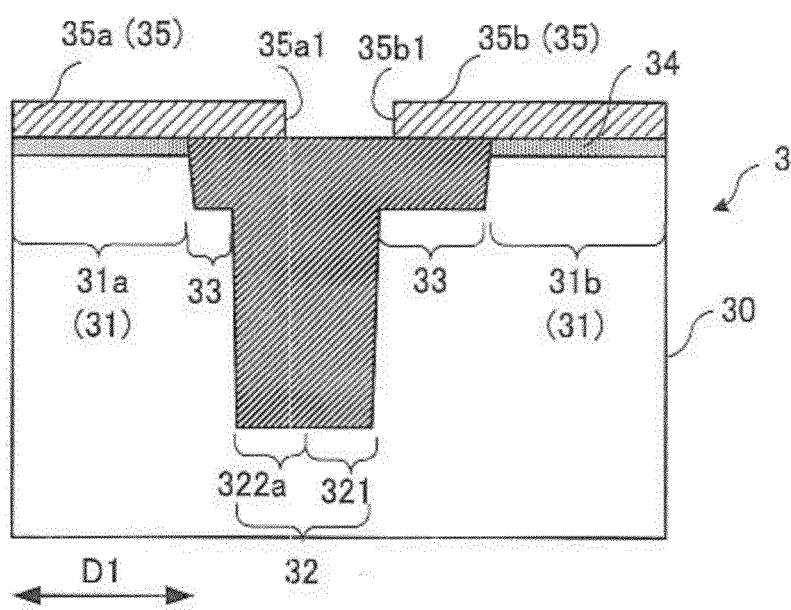
FIG. 25 is a longitudinal cross-sectional view schematically illustrating the semiconductor device taken along a plane indicated by a line S25-S25 in FIG. 22.

FIG. 22 is a plan view schematically illustrating a semiconductor device 3 according to a second embodiment. FIG. 22 illustrates an example in which the semiconductor device 3 includes two semiconductor elements 3a and 3b. The semiconductor elements 3a and 3b are MOS transistors, for example. FIG. 23 is a longitudinal cross-sectional view schematically illustrating the semiconductor device 3 taken along a plane indicated by a line S23-S23 in FIG. 22. FIG. 24 is a longitudinal cross-sectional view schematically illustrating the semiconductor device 3 taken along a plane indicated by a line S24-S24 in FIG. 22. FIG. 25 is a longitudinal cross-sectional view schematically illustrating the semiconductor device 3 taken along a plane indicated by a line S25-S25 in FIG. 22.

Figure 26:
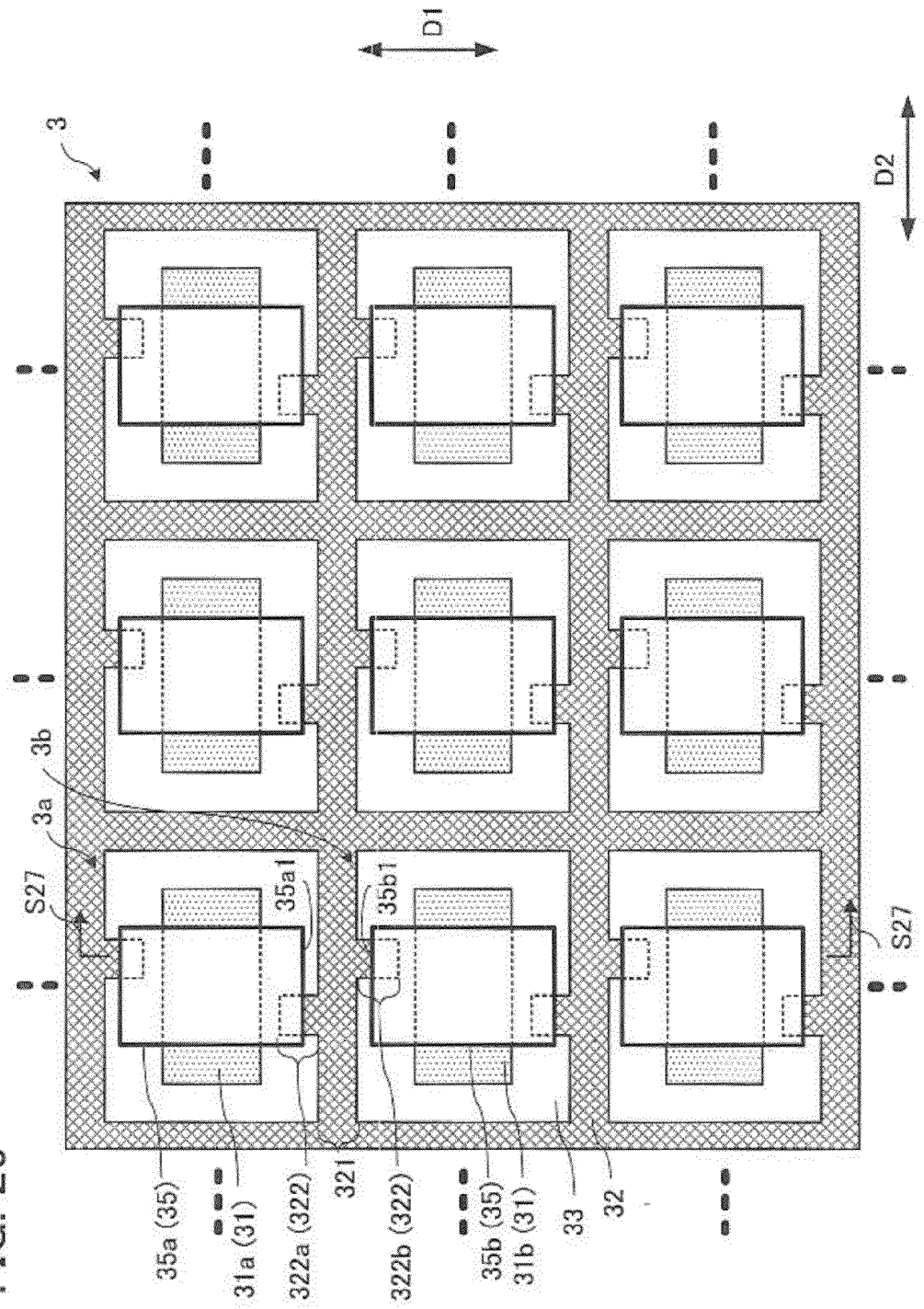
FIG. 26 is a plan view schematically illustrating the semiconductor device according to the second embodiment.
Figure 27:
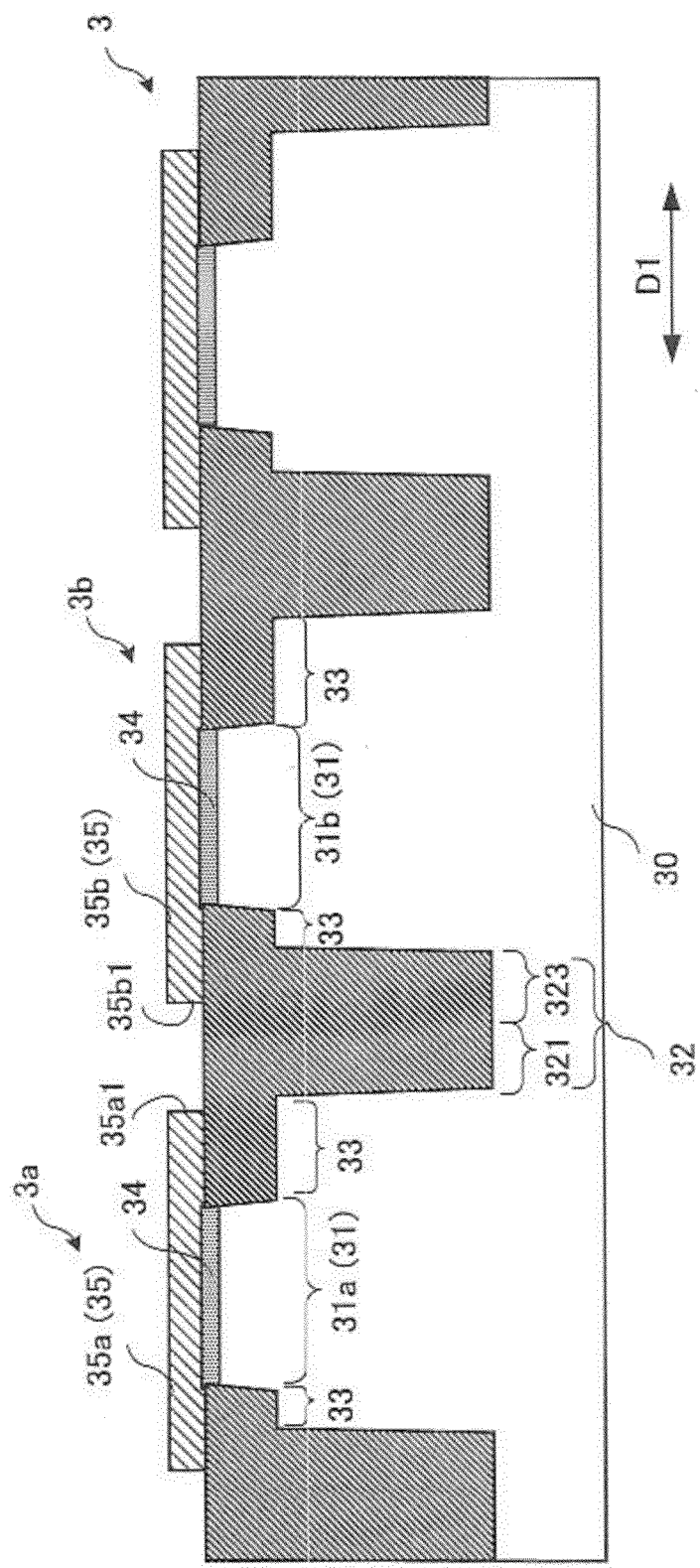
FIG. 27 is a longitudinal cross-sectional view schematically illustrating the semiconductor device taken along a plane indicated by a line S27-S27 in FIG. 26.

FIG. 26 is a plan view schematically illustrating the semiconductor device 3 according to the second embodiment. FIG. 26 illustrates an example in which the semiconductor device 3 includes a plurality of semiconductor elements which is arranged like a matrix. FIG. 27 is a longitudinal cross-sectional view schematically illustrating the semiconductor device 3 taken along a plane indicated by a line S27-S27 in FIG. 26.

As illustrated in FIGS. 22 to 27, the semiconductor device 3 according to the second embodiment has active regions 31 (or 31a, 31b), a first element isolating region 32 (or 321, 322; or 321, 322a, 322b) which is a DTI region, a second element isolating region 33 which is a STI region, gate insulating films 34 (or 34a, 34b), and gate electrodes 35 (or 35a, 35b), in or on a semiconductor substrate 30.

As illustrated in FIG. 22 or 26, the plurality of active regions 31 is arranged so as to be aligned in a first direction D1. The first element isolating region 32 electrically isolates the adjacent active regions 31a and 31b from each other. The second element isolating region 33 is formed between the first element isolating region 32 and the active regions 31. The gate electrode 35 is formed on a surface of the semiconductor substrate 30 so that the gate insulating film 34 is sandwiched between the gate electrode and the semiconductor substrate. The gate electrode 35 is formed so as to extend over the active region 31. The plurality of gate electrodes 35 is formed so as to be aligned in the first direction D1.

As illustrated in FIG. 22, the first element isolating region 32 includes a first region 321 and a second region 322 between the adjacent active regions 31a and 31b. The first region 321 extends in a second direction D2 which is parallel to the surface of the semiconductor substrate 30 and orthogonal to the first direction D1. The second region 322 extends in a direction which is parallel to the surface of the semiconductor substrate 30 and intersects the first region 321. In the second embodiment, the second region 322 of the first element isolating region 32 includes a first protrusion part 322a which protrudes toward the active region 31a which is one of the active regions, and a second protrusion part 322b which protrudes toward the active region 31b which is the other one of the active regions. The first and second protrusion parts 322a and 322b protrude in opposite directions from opposite sides of the first region 321 respectively. In the semiconductor device 3 according to the second embodiment, the first and second protrusion parts 322a and 322b are placed at different positions in the second direction D2 from each other, and the semiconductor device 3 differs from the semiconductor device 1 according to the first embodiment in this point. Except for this point, the second embodiment is the same as the first embodiment.

As illustrated in FIG. 22, in the second embodiment, the plurality of gate electrodes 35 includes adjacent gate electrodes 35a and 35b. The gate electrode 35a which is one of the adjacent gate electrodes 35a and 35b has a first edge side 35a1. The first edge side 35a1 is formed so as to include a first overlap part which is placed on the first protrusion part 322a (i.e., a part which overlaps with the first protrusion part 322a). The gate electrode 35b which is the other one of the adjacent gate electrodes 35a and 35b has a second edge side 35b1 which faces the first edge side 35a1. The second edge side 35b1 is formed so as to include a second overlap part which is placed on the second protrusion part 322b (i.e., a part which overlaps with the second protrusion part 322b). By including the second element isolating region 33 in addition to the first element isolating region 32, i.e., by using the structure where a DTI region is surrounded by a STI region, an influence of the first and second protrusion parts 322a and 322b of the first element isolating region 32 on transistor properties is reduced.

In addition, a method of manufacturing the semiconductor device 3 according to the second embodiment is the same as the method of manufacturing the semiconductor device according to the first embodiment, except for a difference in plane shapes of the first and second element isolating regions as shown in FIG. 1 and FIG. 22.

(2-2) Advantageous Effects of Second Embodiment

In the second embodiment, the first element isolating region 32 includes the first region 321 extending in the second direction D2, and the second region 322 extending in the first direction D1 which intersects the first region 321, between the adjacent active regions 31a and 31b. The second region 322 includes the first protrusion part 322a protruding toward the active region 31a which is one of the adjacent active regions, and the second protrusion part 322b protruding toward the active region 31b which is the other one of the adjacent active regions. The first and second protrusion part 322a and 322b protrude in opposite directions from opposite sides of the first region 321 respectively. For this reason, in the second embodiment, it is effective to form the first edge side 35a1 of the gate electrode 35a and the second edge side 35b1 of the gate electrode 35b within a range of a width W3 which corresponds to a width of the first region 321 and a width of the second region 322 (the first and second protrusion parts 322a and 322b) so that no short circuit occurs between the adjacent gate electrodes. The width W3 illustrated in FIG. 22 is wider than the width W7 of the line-shaped region of the first element isolating region in the first comparative example or the width W8 of the line-shaped region of the first element isolating region in the second comparative example, by a width of the first protrusion part 322a and a width of the second protrusion part 322b. Therefore, at a time of manufacturing of the semiconductor device 3, even if the edge side 35a1 of the gate electrode 35a or the edge side 35b1 of the gate electrode 35b is placed at a slightly different position from an appropriate position, it is possible to reduce a problem that a short circuit occurs between the edge side 35a1 of the gate electrode 35a and the edge side 35b1 of the gate electrode 35b, or a problem that the edge side 35a1 or 35b1 is not placed on the first element isolating region 32.

Moreover, according to the second embodiment, cost can be reduced, in comparison with a case where the first element isolating region 32 is simply formed in a line-shaped region of the width W3, because an insulating material forming the first element isolating region 32 can be saved.

Furthermore, according to the second embodiment, in contrast to the first embodiment, the plane shape of the first element isolating region 32 does not include a cross-shaped intersection part where trench-filling quality is comparatively inferior (because a center of the intersection part is distant from a side of the first element isolating region 32). Therefore, such inferior filling is hard to occur in a process of filling the trench with polysilicon (i.e., a step corresponding to FIG. 9).

(2-3) Modified Example of Second Embodiment

Figure 28:
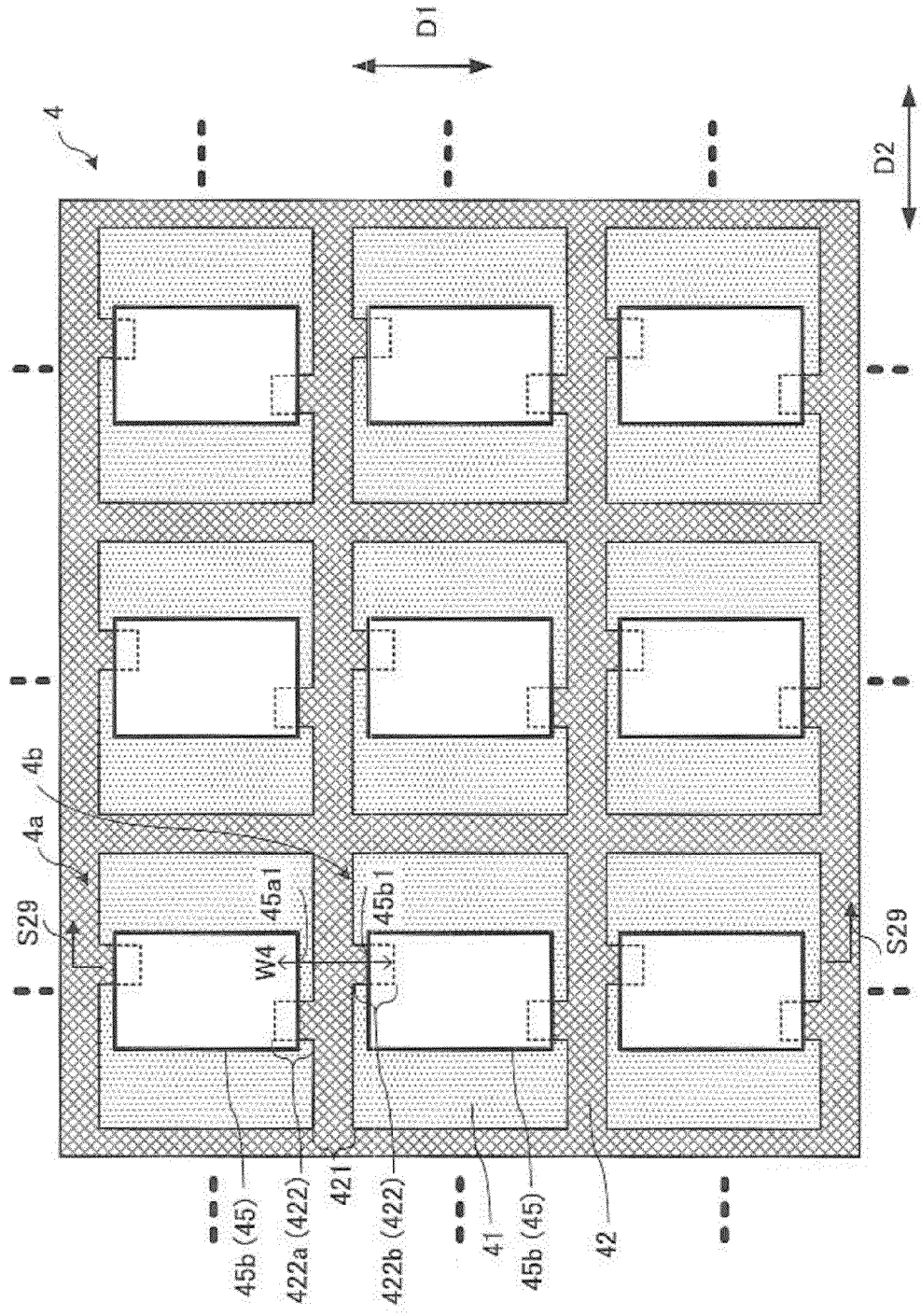
FIG. 28 is a plan view schematically illustrating a semiconductor device according to a modified example of the second embodiment.
Figure 29:
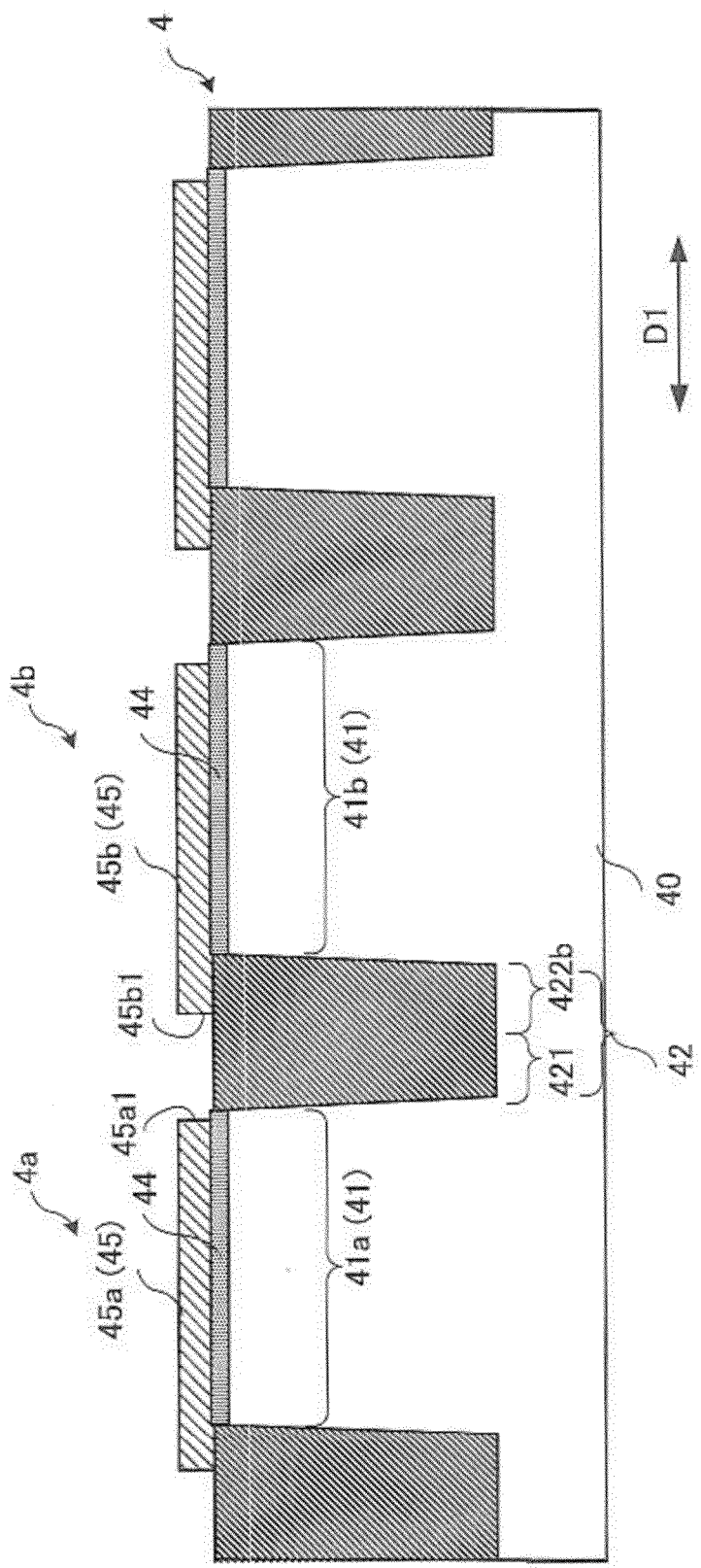
FIG. 29 is a longitudinal cross-sectional view schematically illustrating the semiconductor device taken along a plane indicated by a line S29-S29 in FIG. 28.

FIG. 28 is a plan view schematically illustrating a semiconductor device 4 according to a modified example of the second embodiment. FIG. 29 is a longitudinal cross-sectional view schematically illustrating the semiconductor device 4 taken along a plane indicated by a line S29-S29 in FIG. 28. As illustrated in FIGS. 28 and 29, the semiconductor device 4 (or 4a, 4b) according to the modified example of the second embodiment has a semiconductor substrate 40, active regions 41 (or 41a, 41b), a first element isolating region 42 (or 421, 422; or 421, 422a, 422b) which is a DTI region, gate insulating films 44 (or 44a, 44b), and gate electrodes 45 (or 45a, 45b). The semiconductor device 4 illustrated in FIGS. 28 and 29 does not have the second element isolating region 33, and the semiconductor device 4 differs from the semiconductor device 3 according to the second embodiment in this point.

As illustrated in FIG. 28 or 29, the plurality of active regions 41 is arranged like a matrix in the semiconductor substrate 40. The first element isolating region 42 is formed in the semiconductor substrate 40 and electrically isolates the adjacent active regions 41a and 41b out of the plurality of active region 41 from each other. The gate electrode 45 is formed on a surface of the semiconductor substrate 40 so that the gate insulating film 44 is sandwiched between the gate electrode and the semiconductor substrate. The gate electrode 45 is formed so as to extend over the active regions 41. The plurality of gate electrodes 45 is formed so as to be aligned in a first direction D1.

As illustrated in FIG. 28, the first element isolating region 42 includes a first region 421 and a second region 422 between the adjacent active regions 41a and 41b. The first region 421 extends in a second direction D2 which is parallel to the surface of the semiconductor substrate 40 and orthogonal to the first direction D1. The second region 422 extends in a direction which is parallel to the surface of the semiconductor substrate 40 and intersects the first region 421. In the modified example of the second embodiment, the second region 422 of the first element isolating region 42 includes a first protrusion part 422a which protrudes toward the active region 41a which is one of the adjacent active regions 41a and 41b, and a second protrusion part 422b which protrudes toward the active region 41b which is the other one of the adjacent active regions 41a and 41b. The first and second protrusion parts 422a and 422b are linearly arranged in the first direction D1 and protrude in opposite directions from opposite sides of the first region 421 respectively.

As illustrated in FIG. 29, in the modified example of the second embodiment, the gate electrodes 45 include the gate electrodes 45a and 45b. The gate electrode 45a has a first side edge 45a1. The first side edge 45a1 is formed so as to include a first overlap part which is placed on the first protrusion part 422a (i.e., a part which overlaps with the first protrusion part 422a). The gate electrode 45b is adjacent to the gate electrode 45a and has a second side edge 45b1 which faces the first side edge 45a1. The second side edge 45b1 is formed so as to include a second overlap part which is placed on the second protrusion part 422b (i.e., a part which overlaps with the second protrusion part 422b).

In the modified example of the second embodiment, it is effective to form the first side edge 45a1 of the gate electrode 45a and the second side edge 45b1 of the gate electrode 45b within a range of a width W4 which corresponds to a width of the first region 421 and a width of the second region 422 (the first and second protrusion parts 422a and 422b) so that no short circuit occurs between the adjacent gate electrodes. The width W4 is wider than the width W7 in the first comparative example and wider than the width W8 in the second comparative example. Therefore, even if the edge side 45a1 of the gate electrode 45a or the edge side 45b1 of the gate electrode 45b is placed at a slightly different position from an appropriate position, it is possible to reduce a problem that a short circuit occurs between the edge side 45a1 of the gate electrode 45a and the edge side 45b1 of the gate electrode 45b, or a problem that the edge side 45a1 or 45b1 is not placed on the first element isolating region 42.

Moreover, in the modified example of the second embodiment, the semiconductor device 4 does not have the second element isolating region 13, i.e., does not use the structure where a DTI region is surrounded by a STI region. Therefore, the semiconductor device 4 has a simple structure and its manufacturing processes are also simple.

The modified example of the second embodiment may be applied to a case where the first and second protrusion parts 422a and 422b of the first element isolating region 42 slightly influence transistor properties, or a case where a slight difference in transistor properties is permitted in a use of the transistor.

(3) Third Embodiment (3-1) Semiconductor Device and Manufacturing Method

Figure 30:
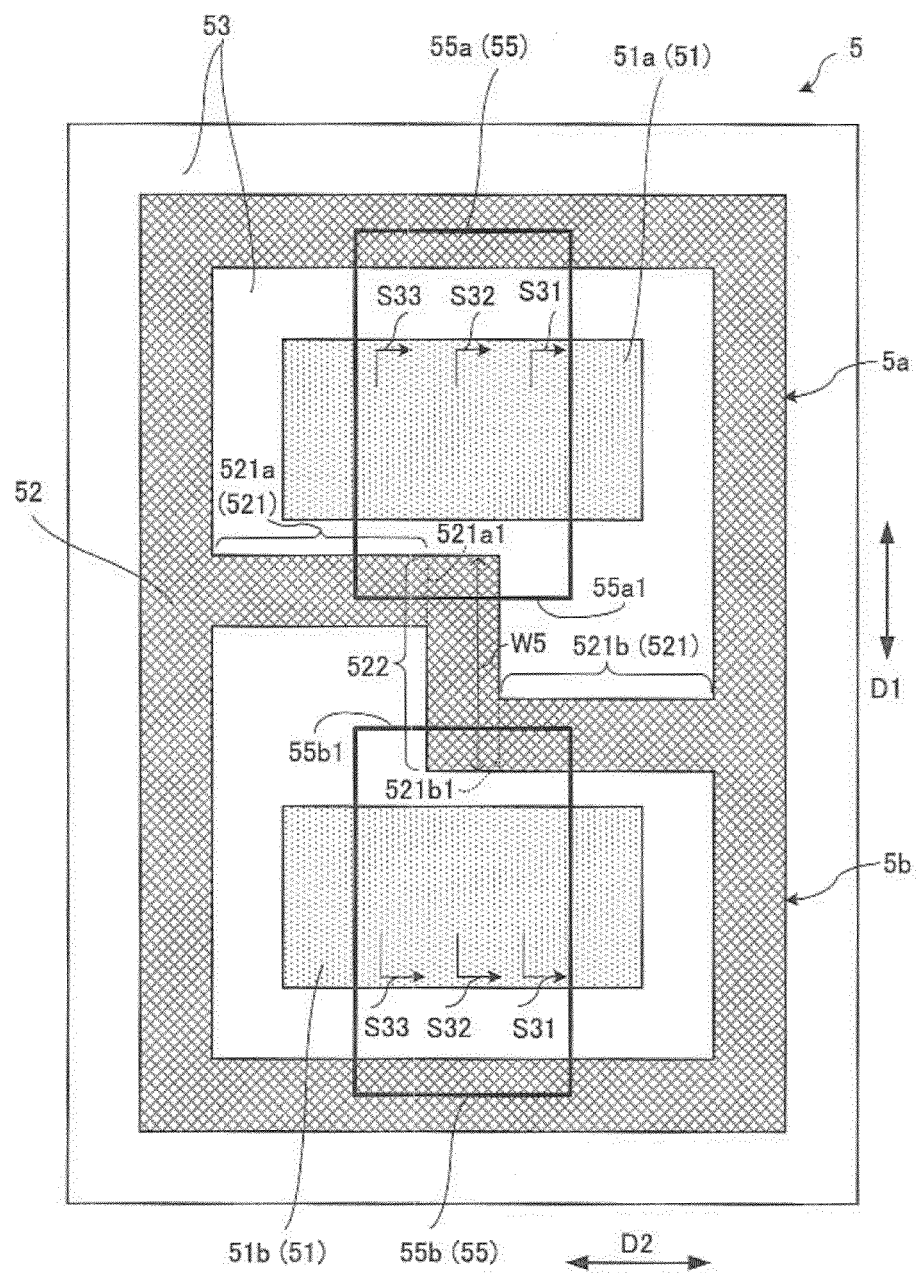
FIG. 30 is a plan view schematically illustrating a semiconductor device according to a third embodiment of the present invention.
Figure 31:
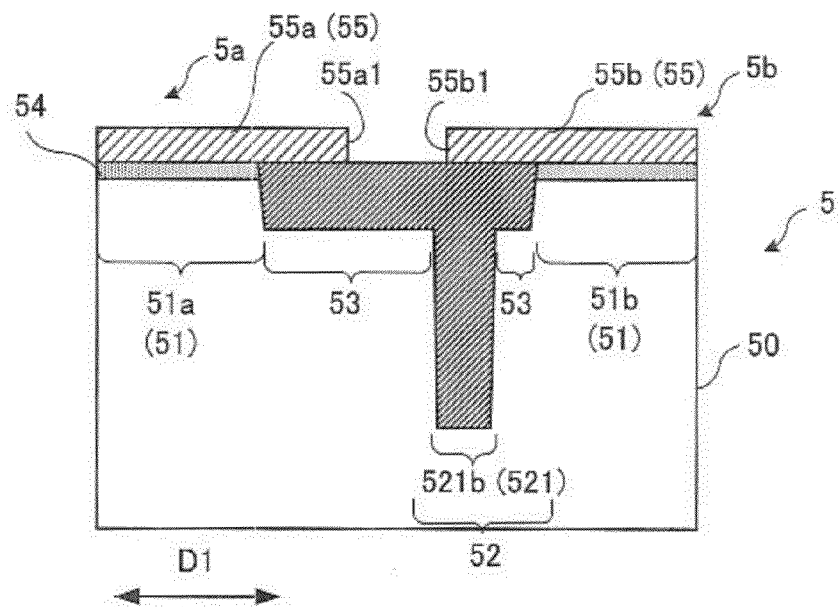
FIG. 31 is a longitudinal cross-sectional view schematically illustrating the semiconductor device taken along a plane indicated by a line S31-S31 in FIG. 30.
Figure 32:
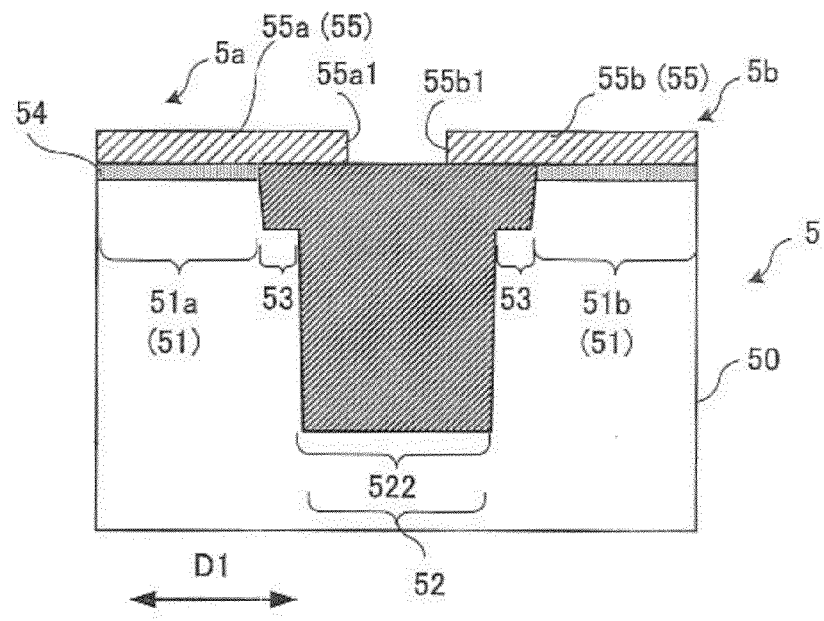
FIG. 32 is a longitudinal cross-sectional view schematically illustrating the semiconductor device taken along a plane indicated by a line S32-S32 in FIG. 30.
Figure 33:
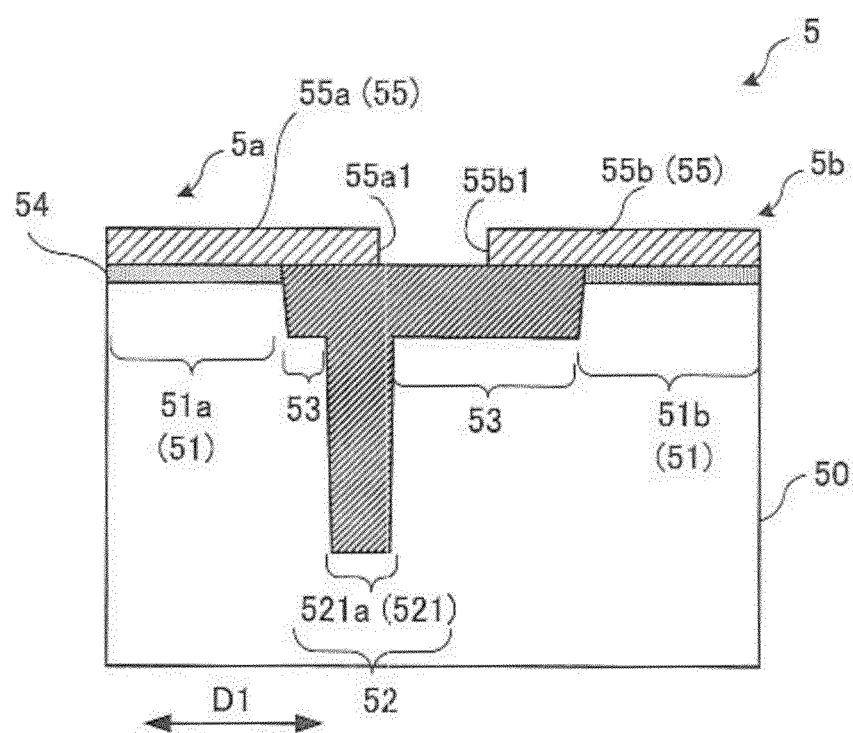
FIG. 33 is a longitudinal cross-sectional view schematically illustrating the semiconductor device taken along a plane indicated by a line S33-S33 in FIG. 30.

FIG. 30 is a plan view schematically illustrating a semiconductor device 5 according to a third embodiment. FIG. 30 illustrates an example in which the semiconductor device 5 includes two semiconductor elements 5a and 5b. The semiconductor elements 5a and 5b are MOS transistors, for example. FIG. 31 is a longitudinal cross-sectional view schematically illustrating the semiconductor device 50 taken along a plane indicated by a line S31-S31 in FIG. 3. FIG. 32 is a longitudinal cross-sectional view schematically illustrating the semiconductor device 5 taken along a plane indicated by a line S32-S32 in FIG. 30. FIG. 33 is a longitudinal cross-sectional view schematically illustrating the semiconductor device 5 taken along a plane indicated by a line S33-S33 in FIG. 30.

Figure 34:
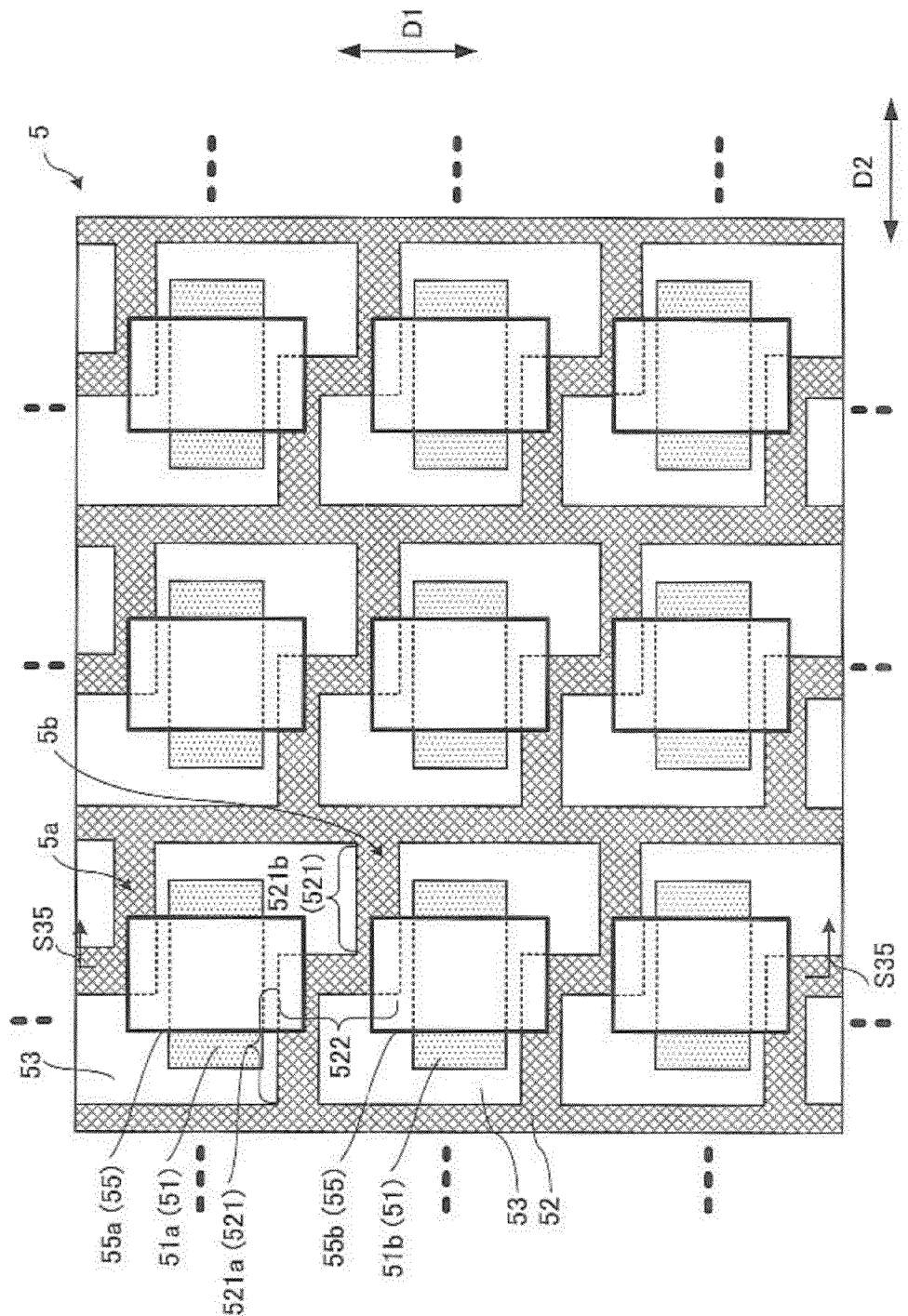
FIG. 34 is a plan view schematically illustrating the semiconductor device according to the third embodiment.
Figure 35:
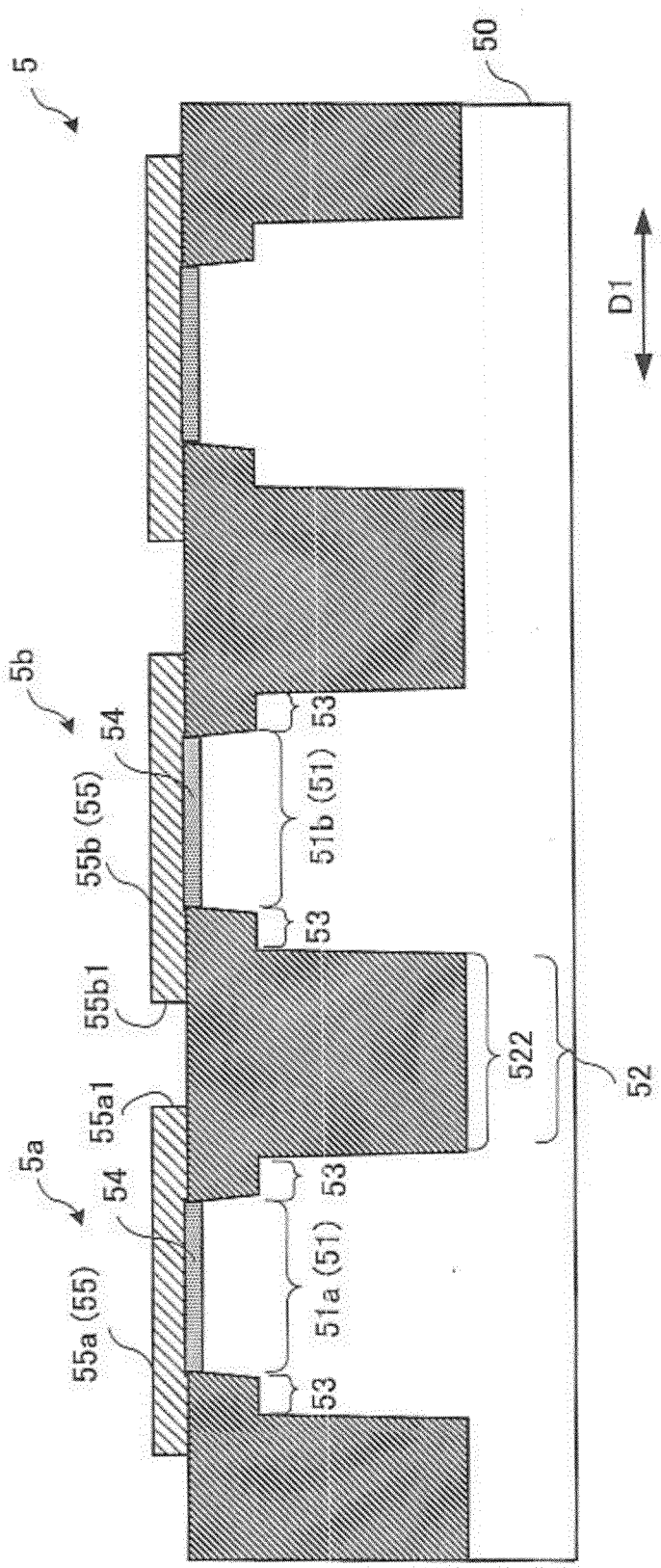
FIG. 35 is a longitudinal cross-sectional view schematically illustrating the semiconductor device taken along a plane indicated by a line S35-S35 in FIG. 34.

FIG. 34 is a plan view schematically illustrating the semiconductor device 5 according to the third embodiment. FIG. 34 illustrates an example in which the semiconductor device 5 includes a plurality of semiconductor elements which is arranged like a matrix. FIG. 35 is a longitudinal cross-sectional view schematically illustrating the semiconductor device 5 taken along a plane indicated by a line S35-S35 in FIG. 34.

As illustrated in FIGS. 30 to 35, the semiconductor device 5 according to the third embodiment has active regions 51 (or 51a, 51b), a first element isolating region 52 (or 521, 522; or 521a, 521b, 522) which is a DTI region, a second element isolating region 53 which is a STI region, gate insulating films 54 (or 54a, 54b), and gate electrodes 55 (or 55a, 55b), in or on a semiconductor substrate 50.

As illustrated in FIG. 30 or 34, the plurality of active regions 51 is arranged so as to be aligned in a first direction D1. The first element isolating region 52 electrically isolates the adjacent active regions 51a and 51b from each other. The second element isolating region 53 is formed between the first element isolating region 52 and the active region 51. The gate electrode 55 is formed on the surface of the semiconductor substrate 50 so that the gate insulating film 54 is sandwiched between the gate electrode and the semiconductor substrate. The gate electrode 55 is formed so as to extend over the active region 51. The plurality of gate electrodes 55 is formed so as to be aligned in the first direction D1.

As illustrated in FIG. 30, the first element isolating region 52 includes a first region 521 and a second region 522 between the adjacent active regions 51a and 51b. The first region 521 extends in a second direction D2 which is parallel to the surface of the semiconductor substrate 50 and orthogonal to the first direction D1. The second region 522 extends in a direction which is parallel to the surface of the semiconductor substrate 50 and intersects the first region 521. In the third embodiment, the first region 521 of the first element isolating region 52 includes a first part 521a which extends in the second direction D2; and a second part 521b which is placed at a different position from that of the first part 521a in the first direction D1 and extends in the second direction D2. As illustrated in FIG. 30, the second region 522 of the first element isolating region 52 includes a third part which connects a first side 521a1 and a second side 521b1. The first side 521a1 is an edge of the first part 521a and points the second direction D2. The second side 521b1 is an edge of the second part 521b and points opposite the first side 521a1 of the first part 521a. The third part illustrated as the second region 522 in FIG. 30 has a shape extending in the first direction D1. In the semiconductor device 5 according to the third embodiment, a shape of the first element isolating region 52 is different from those in the semiconductor devices 1 and 3 according to the first and second embodiments. Except for this point, the third embodiment is the same as the first and second embodiments.

As illustrated in FIG. 34, in the third embodiment, the plurality of gate electrodes 55 includes adjacent gate electrodes 55a and 55b. The gate electrode 55a which is one of the adjacent gate electrodes has a first edge side 55a1. The first edge side 55a1 is formed so as to include a first overlap part which is placed on the second region 522. The gate electrode 55b which is the other one of the adjacent gate electrodes has a second edge side 55b1 which faces the first edge side 55a1. The second edge side 55b1 is formed so as to include the first overlap part which is placed on the second region 522. By including the second element isolating region 53 in addition to the first element isolating region 52, i.e., by using the structure where a DTI region is surrounded by a STI region, an influence of the shape of the first element isolating region 52 on transistor properties is reduced.

In addition, a method of manufacturing the semiconductor device 5 according to the third embodiment is the same as the method of manufacturing the semiconductor device according to the first embodiment, except for a difference in plane shapes of the first and second element isolating regions as shown in FIG. 1 and FIG. 30.

(3-2) Advantageous Effects of Third Embodiment

In the third embodiment, the first element isolating region 52 includes the first region 521 (or 521a, 521b) which extends in the second direction D2, and the second region 522 which extends in the first direction D1 and intersects the first region 521, between the adjacent active regions 51a and 51b. For this reason, in the third embodiment, it is effective to form the first edge side 55a1 of the gate electrode 55a and the second edge side 55b1 of the gate electrode 55b within a range of a width W5 which corresponds to a width of the second region 522 so that no short circuit occurs between the adjacent gate electrodes. The width W5 illustrated in FIG. 30 is wider than the width W7 of the line-shaped region of the first element isolating region in the first comparative example or the width W8 of the line-shaped region of the first element isolating region in the second comparative example. Therefore, at a time of manufacturing of the semiconductor device 5, even if the edge side 55a1 of the gate electrode 55a or the edge side 55b1 of the gate electrode 55b is placed at a slightly different position from an appropriate position, it is possible to reduce a problem that a short circuit occurs between the edge side 55a1 of the gate electrode 55a and the edge side 55b1 of the gate electrode 55b, or a problem that the edge side 55a1 or 55b1 is not placed on the first element isolating region 52.

Moreover, according to the third embodiment, cost can be reduced, in comparison with a case where the first element isolating region 52 is simply formed as a line-shaped region of the width W5, because an insulating material forming the first element isolating region 52 can be saved.

Furthermore, according to the third embodiment, in contrast to the first and second embodiments, the plane shape of the first element isolating region 52 does not include a cross-shaped or T-shaped intersection part where trench-filling quality is comparatively inferior (because a center of the intersection part is distant from a side of the second element isolating region). Therefore, such inferior filling is hard to occur in a process of filling the trench with polysilicon (i.e., a step corresponding to FIG. 9).

(3-3) Modified Example of Third Embodiment

Figure 36:
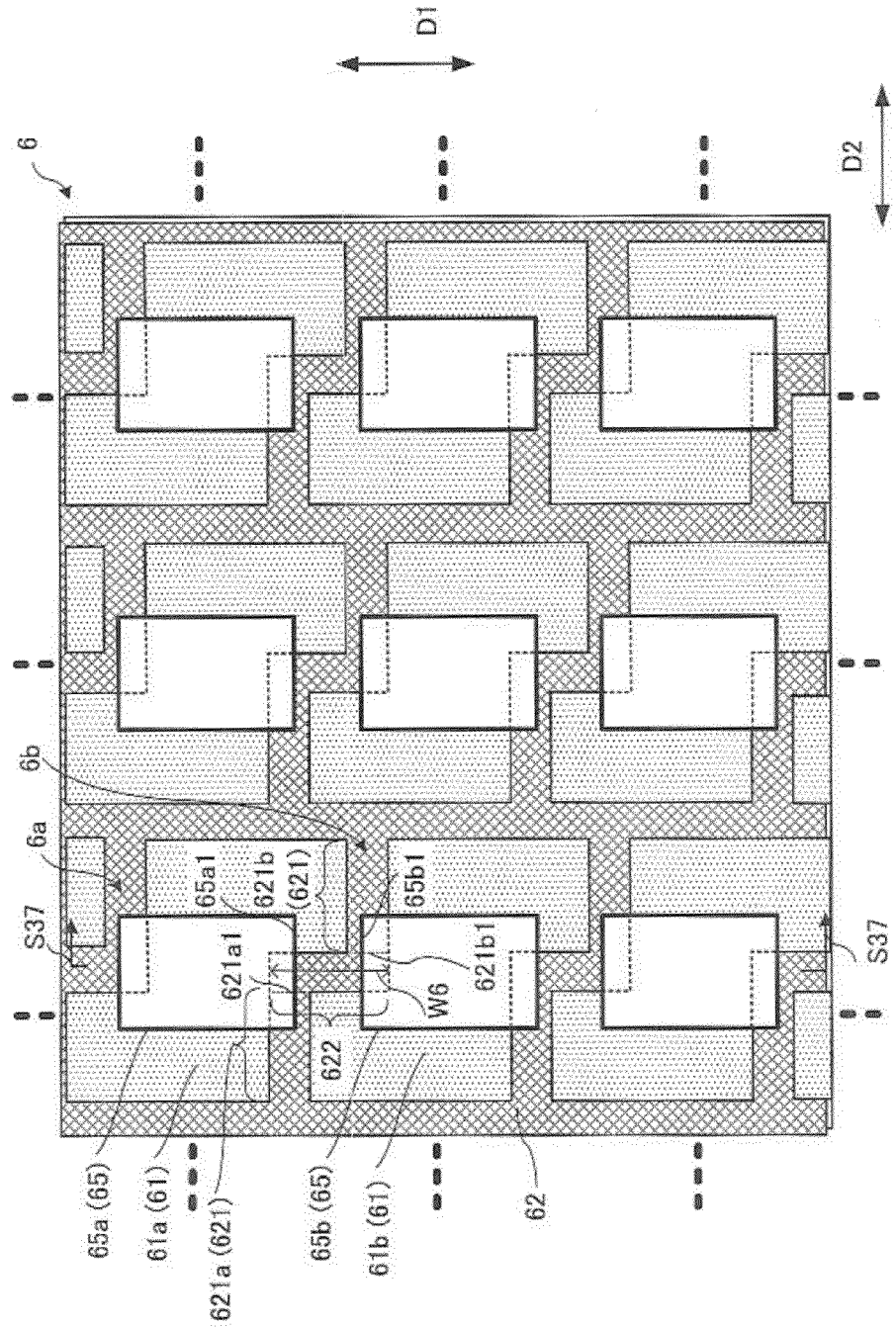
FIG. 36 is a plan view schematically illustrating a semiconductor device according to a modified of the third embodiment.
Figure 37:
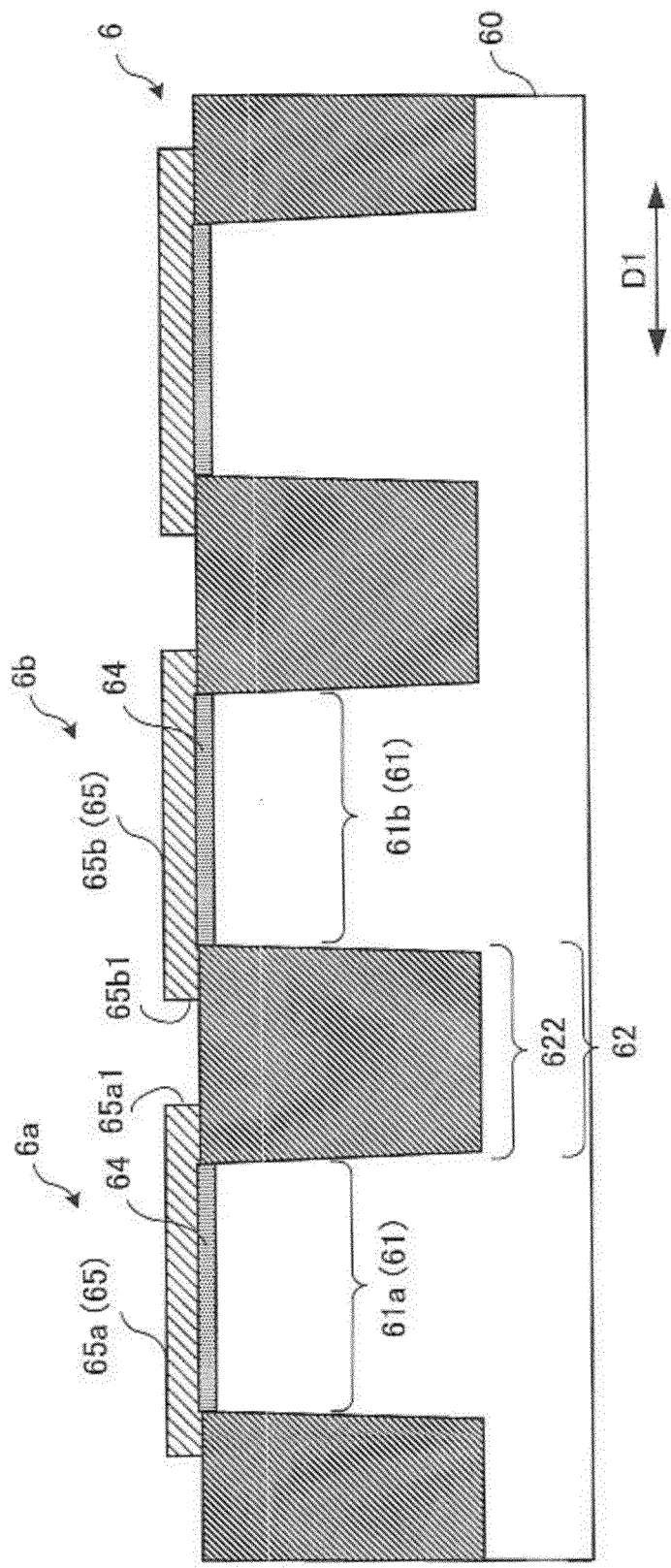
FIG. 37 is a longitudinal cross-sectional view schematically illustrating the semiconductor device taken along a plane indicated by a line S37-S37 in FIG. 36.

FIG. 36 is a plan view schematically illustrating a semiconductor device 6 according to a modified example of the third embodiment. FIG. 37 is a longitudinal cross-sectional view schematically illustrating the semiconductor device 6 taken along a plane indicated by a line S37-S37 in FIG. 36. As illustrated in FIGS. 36 and 37, the semiconductor device 6 (or 6a, 6b) according to the modified example of the third embodiment has a semiconductor substrate 60, active regions 61 (or 61a, 61b), a first element isolating region 62 (or 621, 622; or 621a, 621b, 622) which is a DTI region, gate insulating films 64 (or 64a, 64b), and gate electrodes 65 (or 65a, 65b). The semiconductor device 6 illustrated in FIGS. 36 and 37 does not have the second element isolating region 53, and the semiconductor device 6 differs from the semiconductor device 5 in the third embodiment in this point.

As illustrated in FIG. 36 or 37, the plurality of active regions 61 is arranged like a matrix in the semiconductor substrate 60. The first element isolating region 62 is formed in the semiconductor substrate 60 and electrically isolates the adjacent active regions 61a and 61b out of the plurality of active regions 61 from each other. The gate electrode 65 is formed on a surface of the semiconductor substrate 60 so that the gate insulating film 64 is sandwiched between the gate electrode and the semiconductor substrate. The gate electrode 65 is formed so as to extend over the active region 61. The plurality of gate electrodes 65 is formed so as to be aligned in a first direction D1.

As illustrated in FIG. 36, a first region 621 of the first element isolating region 62 includes a first part 621a which extends in a second direction D2, and a second part 621b which is placed at a position different from that of the first part 621a in the first direction D1 and extends in the second direction D2. As illustrated in FIG. 36, a second region 622 of the first element isolating region 62 includes a third part which connects a first side 621a1 and a second side 621b1. The first side 621a1 is an edge of the first part 621a and points the second direction D2. The second side 621b1 is an edge of the second part 621b and points opposite the first side 621a1 of the first part 621a. The third part is illustrated as the second region 622 in FIG. 36 and has a shape extending in the first direction D1.

As illustrated in FIG. 37, in the modified example of the third embodiment, the gate electrodes 65 include gate electrodes 65a and 65b. The gate electrode 65a has a first edge side 65a1. The first edge side 65a1 is formed so as to include a first overlap part which is placed on the second region 622. The gate electrode 65b is adjacent to the gate electrode 65a and has a second edge side 65b1 which faces the first edge side 65a1. The second edge side 65b1 is formed so as to include a second overlap part which is placed on the second region 622.

In the modified example of the third embodiment, it is effective to form the first edge side 65a1 of the gate electrode 65a and the second edge side 65b1 of the gate electrode 65b within a range of a width W6 which corresponds to a width of the second region 622. The width W6 is wider than the width W7 in the first comparative example and wider than the width W8 in the second comparative example. Therefore, even if the edge side 65a1 of the gate electrode 65a or the edge side 65b1 of the gate electrode 65b is placed at a slightly different position from an appropriate position, it is possible to reduce a problem that a short circuit occurs between the edge side 65a1 of the gate electrode 65a and the edge side 65b1 of the gate electrode 65b, or a problem that the edge side 65a1 or 65b1 is not placed on the first element isolating region 62.

Moreover, the semiconductor device 6 in the modified example of the third embodiment does not have the second element isolating region 53, i.e., does not use the structure where a DTI region is surrounded by a STI region. Therefore, the semiconductor device 6 has a simple structure and its manufacturing processes are also simple.

The modified example of the third embodiment may be applied to a case where the shape of the first element isolating region 62 slightly influences transistor properties, or a case where a slight difference in transistor properties is permitted in a use of the transistor.

(4) Additional Modified Example

Figure 38:
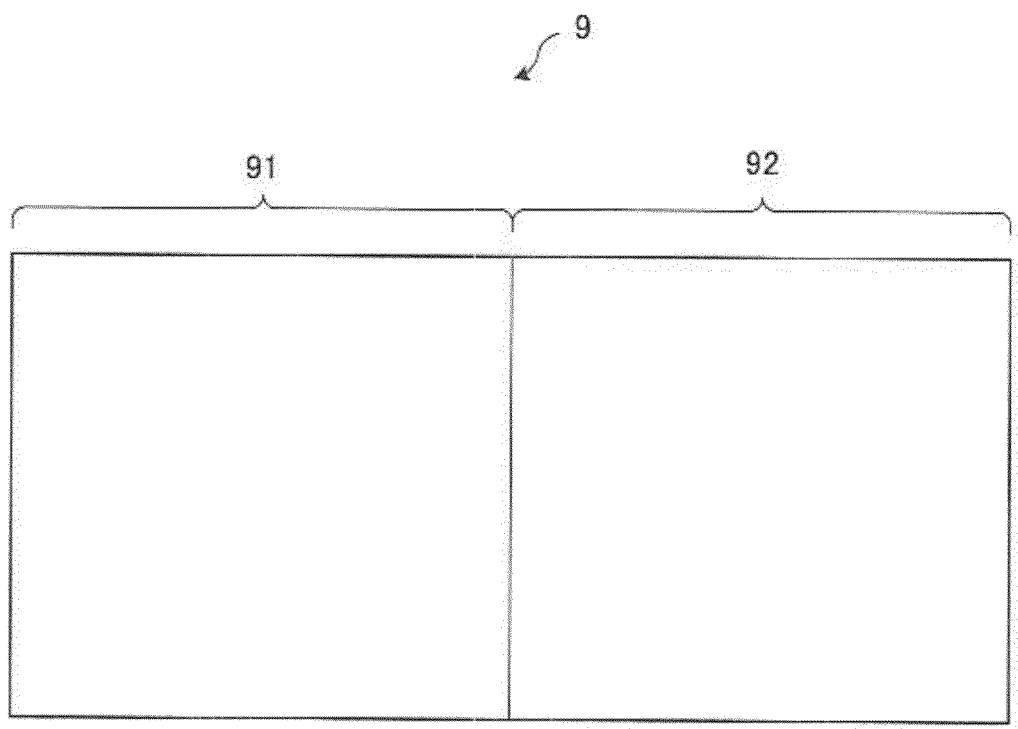
FIG. 38 is a plan view schematically illustrating a semiconductor device in a modified example.

FIG. 38 is a plan view schematically illustrating a semiconductor device 9 in a modified example. As illustrated in FIG. 38, the semiconductor device 9 is a shared semiconductor substrate having a high-voltage element region 91 and a low-voltage element region 92. The high-voltage element region 91 is formed on the shared semiconductor substrate 9 and includes a high-voltage element. The low-voltage element region 92 is formed on the shared semiconductor substrate 9 and includes a logic circuit which has lower breakdown-voltage performance than that of the high-voltage element region 91. The semiconductor devices 1 to 6 according to the first to third embodiments may be applied to a device which includes the high-voltage element region (or a memory region) 91 and the low-voltage element region (or a logic circuit region) 92 on the shared semiconductor substrate 9, as illustrated in FIG. 38. The device including the high-voltage element region and the low-voltage element region may be a semiconductor integrated circuit device described in Japanese Patent Application Publication No. 2001-168164, for example. Moreover, in such a case, it is desirable to apply to the high-voltage element region 91 any of the structures of the semiconductor devices 1 to 6 in the first to third embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A semiconductor device comprising:
   a plurality of active regions formed in a semiconductor substrate, the plurality of active regions being arranged in a first direction which is parallel to a surface of the semiconductor substrate;
   a first element isolating region formed in the semiconductor substrate, the first element isolating region electrically isolating adjacent active regions out of the plurality of active regions from each other; and
   a plurality of gate electrodes formed on the surface of the semiconductor substrate so that the plurality of the gate electrodes extends over the plurality of active regions respectively, the plurality of gate electrodes being arranged in the first direction; wherein
   the first element isolating region includes, between the adjacent active regions, a first region extending in a second direction which is parallel to the surface and orthogonal to the first direction and a second region extending in a direction which is parallel to the surface and intersects the first region,
   one gate electrode of adjacent gate electrodes out of the plurality of gate electrodes has a first edge side which includes a first overlap part placed on the second region, and
   another gate electrode of the adjacent gate electrodes has a second edge side which faces the first edge side and includes a second overlap part placed on the second region.

2. The semiconductor device according to claim 1, further comprising: a second element isolating region formed in the semiconductor substrate between the first element isolating region and the active region,
   wherein a depth of the second element isolating region is less than a depth of the first element isolating region.

3. The semiconductor device according to claim 2, wherein the second region of the first element isolating region includes:
   a first protrusion part that protrudes toward one active region of the adjacent active regions in the second element isolating region; and
   a second protrusion part that protrudes toward another active region of the adjacent active regions in the second element isolating region.

4. The semiconductor device according to claim 1, wherein the second region of the first element isolating region includes:
   a first protrusion part that protrudes toward one active region of the adjacent active regions; and
   a second protrusion part that protrudes toward another active region of the adjacent active regions.

5. The semiconductor device according to claim 4, wherein the first protrusion part and the second protrusion part are linearly arranged in the first direction.

6. The semiconductor device according to claim 4, wherein the first protrusion part and the second protrusion part are placed at different positions in the second direction, and the first protrusion part and the second protrusion part protrude in opposite directions parallel to the first direction respectively.

7. The semiconductor device according to claim 1, wherein
   the first region of the first element isolating region includes:
   a first part extending in the second direction; and
   a second part extending in the second direction at a position different from a position of the first part in the first direction; and
   the second region of the first element isolating region includes a third part for connecting a first side that is an edge of the first part and a second side that is an edge of the second part, the first side and the second side pointing in opposite directions parallel to the second direction respectively.

8. The semiconductor device according to claim 7, wherein the third part extends in the first direction.

9. A method of manufacturing a semiconductor device, the method comprising:
   forming a plurality of active regions in a semiconductor substrate, the plurality of active regions being arranged in a first direction which is parallel to a surface of the semiconductor substrate;
   forming a first element isolating region in the semiconductor substrate, the first element isolating region electrically isolating adjacent active regions out of the plurality of active regions from each other; and
   forming a plurality of gate electrodes on the surface of the semiconductor substrate so that the plurality of gate electrodes extends over the plurality of active regions respectively, the plurality of gate electrodes being arranged in the first direction; wherein
   said forming of the first element isolating region is performed so that the first element isolating region includes, between the adjacent active regions, a first region extending in a second direction which is parallel to the surface and orthogonal to the first direction and a second region extending in a direction which is parallel to the surface and intersects the first region, and said forming of the plurality of gate electrodes is performed so that one gate electrode of adjacent gate electrodes out of the plurality of gate electrodes has a first edge side which includes a first overlap part placed on the second region, and another gate electrode of the adjacent gate electrodes has a second edge side which faces the first edge side and includes a second overlap part placed on the second region.

10. The method according to claim 9, further comprising: forming a second element isolating region in the semiconductor substrate between the first element isolating region and the active region, wherein a depth of the second element isolating region is less than a depth of the first element isolating region.

11. The method according to claim 9, wherein the second region of the first element isolating region includes:

a first protrusion part that protrudes toward one active region of the adjacent active regions; and a second protrusion part that protrudes toward another active region of the adjacent active regions.

12. The method according to claim 11, wherein the second region of the first element isolating region includes:

a first protrusion part that protrudes toward one active region of the adjacent active regions in the second element isolating region; and a second protrusion part that protrudes toward another active region of the adjacent active regions in the second element isolating region.

13. The method according to claim 11, wherein the first protrusion part and the second protrusion part are linearly arranged in the first direction.

14. The method according to claim 11, wherein the first protrusion part and the second protrusion part are placed at different positions in the second direction, and the first protrusion part and the second protrusion part protrude in opposite directions parallel to the first direction respectively.

15. The method according to claim 9, wherein the first region of the first element isolating region includes:

a first part extending in the second direction; and a second part extending in the second direction at a position different from a position of the first part in the first direction; and the second region of the first element isolating region includes a third part for connecting a first side that is an edge of the first part and a second side that is an edge of the second part, the first side and the second side pointing in opposite directions parallel to the second direction respectively.

16. The method according to claim 15, wherein the third part extends in the first direction.

17. A semiconductor device comprising:

a high-voltage element region formed in a semiconductor substrate, the high-voltage element region including a high-voltage element having a high breakdown voltage; and a low-voltage element region formed on the semiconductor substrate, the low-voltage element region including a logic circuit having a breakdown voltage lower than the high breakdown voltage of the high-voltage element region; wherein the high-voltage element region includes:

a plurality of active regions formed in a semiconductor substrate, the plurality of active regions being arranged in a first direction which is parallel to a surface of the semiconductor substrate;

a first element isolating region formed in the semiconductor substrate, the first element isolating region electrically isolating adjacent active regions out of the plurality of active regions from each other; and a plurality of gate electrodes formed on the surface of the semiconductor substrate so that the plurality of the gate electrodes extends over the plurality of active regions respectively, the plurality of gate electrodes being arranged in the first direction; wherein the first element isolating region includes, between the adjacent active regions, a first region extending in a second direction which is parallel to the surface and orthogonal to the first direction and a second region extending in a direction which is parallel to the surface and intersects the first region, one gate electrode of adjacent gate electrodes out of the plurality of gate electrodes has a first edge side which includes a first overlap part placed on the second region, and another gate electrode of the adjacent gate electrodes has a second edge side which faces the first edge side and includes a second overlap part placed on the second region.

* * * * *